US012771347B1

(12) United States Patent
Alameh et al.

(10) Patent No.: US 12,771,347 B1
(45) Date of Patent: Oct. 20, 2026

(54) SYSTEM AND METHOD FOR ORCHESTRATING ADAPTIVE CAPACITIVE SENSOR GROUPINGS OF A CAPACITIVE SPLIT CONTACTLESS KEYBOARD FOR AN INFORMATION HANDLING SYSTEM

(71) Applicant: Dell Products LP, Round Rock, TX (US)

(72) Inventors: Rachid M. Alameh, Crystal Lake, IL (US); Brandon Joel Brocklesby, Pflugerville, TX (US); Jason Scott Morrison, Chadron, NE (US)

(73) Assignee: DELL PRODUCTS LP, Round Rock, TX (US)

( * ) Notice: Subject to any disclaimer, the term of this patent is extended or adjusted under 35 U.S.C. 154(b) by 0 days.

(21) Appl. No.: 19/285,782

(22) Filed: Jul. 30, 2025

(51) Int. Cl.
*H03K 17/96* (2006.01)
*G06F 3/01* (2006.01)
*G06F 3/023* (2006.01)

(52) U.S. Cl.
CPC ......... *H03K 17/9622* (2013.01); *G06F 3/017* (2013.01); *G06F 3/0233* (2013.01)

(58) Field of Classification Search
CPC .... H03K 17/9622; G06F 3/017; G06F 3/0233
See application file for complete search history.

(56) References Cited

U.S. PATENT DOCUMENTS

| | | | |
|---|---|---|---|
| 11,817,275 | B2 | 11/2023 | Wang et al. |
| 2007/0199804 | A1 | 8/2007 | Joseph et al. |
| 2009/0073128 | A1 | 3/2009 | Marsden |
| 2011/0102326 | A1 | 5/2011 | Casparian et al. |
| 2012/0228111 | A1 | 9/2012 | Peterson et al. |
| 2014/0062684 | A1 | 3/2014 | Casparian et al. |
| 2014/0097857 | A1 | 4/2014 | Hu |
| 2014/0224633 | A1 | 8/2014 | Peterson et al. |
| 2016/0195955 | A1 | 7/2016 | Picciotto et al. |
| 2018/0217668 | A1 | 8/2018 | Ligtenberg et al. |
| 2018/0217669 | A1 | 8/2018 | Ligtenberg et al. |
| 2018/0218859 | A1 | 8/2018 | Ligtenberg et al. |
| 2020/0278747 | A1 | 9/2020 | Ligtenberg et al. |
| 2021/0165513 | A1 | 6/2021 | Liu et al. |
| 2021/0407748 | A1 | 12/2021 | Wang et al. |

(Continued)

FOREIGN PATENT DOCUMENTS

WO 2016/111876 A1 7/2016

*Primary Examiner* — Sardis F Azongha
(74) *Attorney, Agent, or Firm* — Prol Intellectual Property Law, PLLC; H. Kenneth Prol

(57) ABSTRACT

A split keyboard structure of an information handling system may comprise a keyboard sensing hardware structure including capacitive pad sensors in a capacitive pads layer formed under a sealed input surface of the keyboard sensing hardware structure to detect capacitive changes from user interaction with a removable tactile input layer, and a host microprocessor to execute machine readable code instructions to identify user touch input based on a first detected capacitive change sensed simultaneously at a first subset of capacitive pad sensors operatively coupled to the host microprocessor in a first capacitive change sensing region and a second detected capacitive changed sensed simultaneously at a second subset of capacitive pad sensors in a second capacitive change sensing region to increase regions across the capacitive pads layer which touch inputs are sensed beyond that of individual keyboard keys to decrease processing time to detect user touch input.

20 Claims, 10 Drawing Sheets

(56) References Cited

U.S. PATENT DOCUMENTS

| | | | |
|---|---|---|---|
| 2022/0326777 | A1 | 10/2022 | Ligtenberg et al. |
| 2023/0333658 | A1 | 10/2023 | Wang et al. |
| 2024/0047156 | A1 | 2/2024 | Wang et al. |
| 2025/0044874 | A1 | 2/2025 | Ligtenberg et al. |

SYSTEM AND METHOD FOR ORCHESTRATING ADAPTIVE CAPACITIVE SENSOR GROUPINGS OF A CAPACITIVE SPLIT CONTACTLESS KEYBOARD FOR AN INFORMATION HANDLING SYSTEM

FIELD OF THE DISCLOSURE

The present disclosure generally relates to a system and method for detecting human input via a contactless keyboard sensing hardware structure at a split structure keyboard for an information handling system. The present disclosure more specifically relates systems and methods for orchestrating input sampled and received from plural capacitive pad sensor groupings in a keyboard sensing hardware structure with one or more capacitive sense microprocessors based on a current user input, including a key press measurement input mode, a touch input mode, and a touchless gesture input mode at the capacitive split contactless keyboard of an information handling system.

BACKGROUND

As the value and use of information continues to increase, individuals and businesses seek additional ways to process and store information. One option available are information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. The information handling system may be used to execute instructions of one or more workspace productivity applications such as for teleconferencing, word processing, sales systems, business software, gaming applications, or the like. In some embodiments, a user interface via a keyboard or other input/output (I/O) device may be used with an information handling system for access and input commands.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
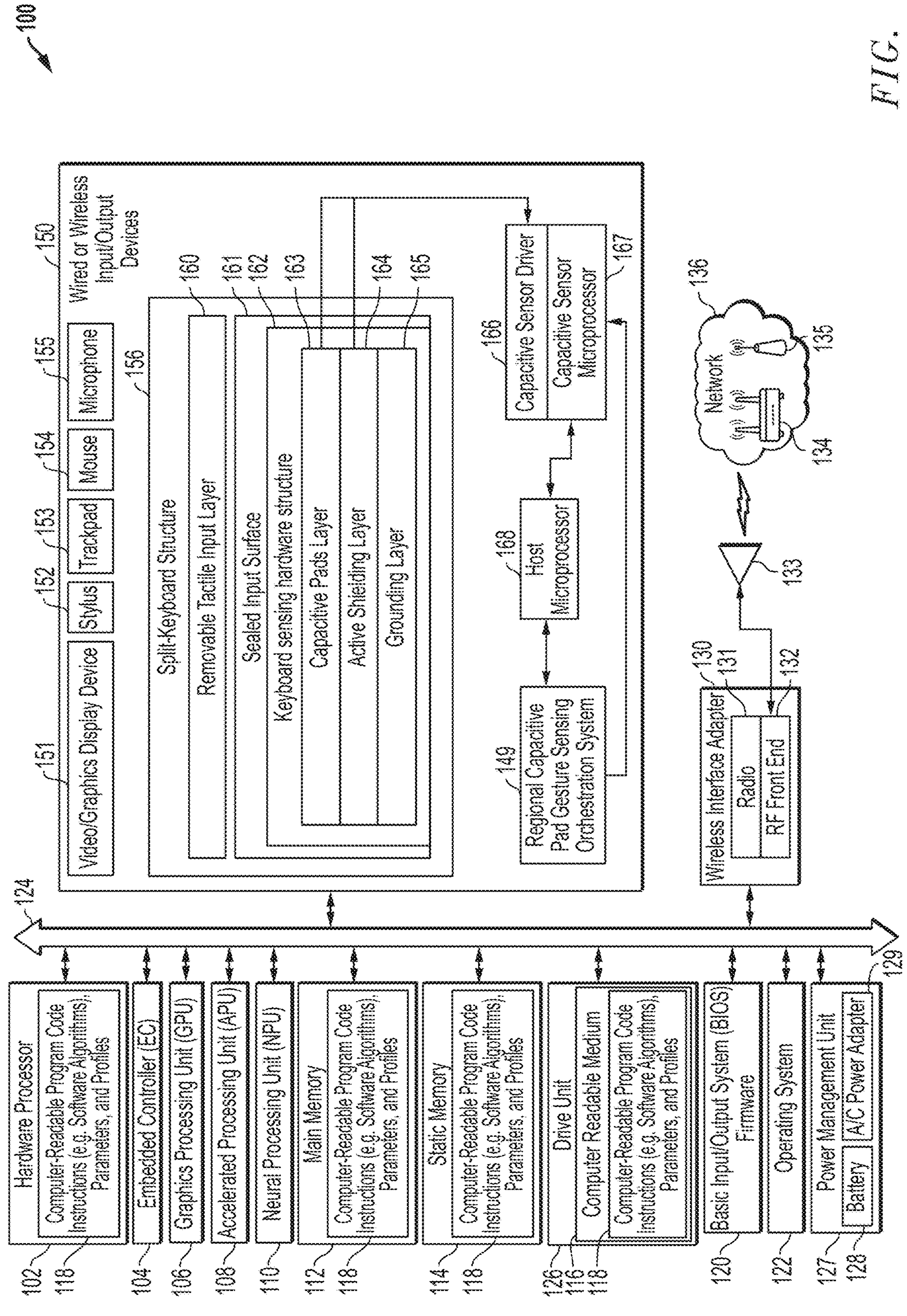
FIG. 1 is a block diagram illustrating an information handling system that includes a split keyboard stack structure having a separate removable tactile input layer and a sealed input surface of a keyboard chassis to receive touch and gesture input from a user contactlessly at capacitive pad sensors in a keyboard sensing hardware structure formed under the sealed input surface according to an embodiment of the present disclosure.

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Information handling systems may include one or more input/output (I/O) devices for receiving user input and which may include a keyboard, a touchpad, a gesture sensing device such as a camera or infrared camera among other I/O devices. Laptop-type information handling systems include a built-in keyboard. These built-in keyboards are integrated into a base chassis portion or keyboard chassis of the laptop-type information handling system. The present specification describes a keyboard that may be used with a laptop-type information handling system that includes split keyboard type design with a purely mechanical removable tactile input layer that may include keyboard keys that a user may use to provide input to the laptop-type information handling system. The laptop-type information handling system in the present specification also includes a sealed input surface at a top portion of the keyboard chassis with a keyboard sensing hardware structure formed under the sealed input surface that is separate from the removable tactile input layer. This sealed input surface may include embedded capacitive sensing technologies, such as a layer array of capacitive pad sensors in the keyboard sensing hardware structure formed under the sealed input surface that detects keystrokes made on the removable tactile input layer in embodiments herein. In an embodiment, the split keyboard structure for the information handling system may include one or a plurality of capacitive sensor microprocessors to execute machine readable code instructions of capacitive sensor drivers that detect changes in capacitance at one or more capacitive pad sensors from user input at the removable tactile input layer installed above the sealed input surface. For example, capacitive changes may be detected at the capacitive pad sensors of a keyboard sensing hardware structure formed under the sealed input surface from keypresses of keys on the removable tactile input layer as well as touch inputs or user touchless gesture inputs at or above the removable tactile input layer in various embodiments.

The information handling system may comprise a hardware processor, a data storage device, and a power management unit (PMU) to provide power to the hardware processor and data storage device. In embodiments herein, the information handling system may include the keyboard sensing hardware structure formed under the sealed input surface, as part of the split keyboard structure, that is operatively coupled to one or a plurality of capacitive sensor microprocessors as well as a host microprocessor orchestrating input from a plurality of capacitive sensor microprocessors, and the hardware processor of the information handling system to receive one or more types of I/O input from the user. The split keyboard structure may also include the removable tactile input layer that receives mechanical tactile input from a user, such as keypress of mechanical-only portion of keyboard keys and which also may be used for touch inputs on the keyboard keys or gesture inputs above the keyboard keys that may be detected by capacitive sensing pads of the keyboard sensing hardware structure formed under the sealed input surface in embodiments. This removable tactile input layer may be installed over the sealed input surface via interference fit, magnetic interface structures, mechanical latch or other structure such that the removable tactile input layer is detachable and replaceable with a new or different removable tactile input layer, such as a new mechanical-only portion of the split-keyboard structure, without need to access or replace the keyboard sensing hardware structure under the sealed input surface. The keyboard sensing hardware structure may include a capacitive pads layer comprising a plurality of capacitive pad sensors operatively coupled to a power source such as a PMU and one or more capacitive sensor microprocessors to detect capacitive changes proximate to the sealed input surface. The capacitive pad sensors may be formed of carbon-based conductive deposits on a flexible printed circuit board or on the undersurface of the sealed input surface. Additionally, these capacitive pad sensors formed as carbon-based conductive deposits may be delicate and subject to scratching or damage if exposed to mechanical actuation or moving parts, but which are protected from contact in the keyboard sensing hardware structure formed under the sealed input surface according to embodiments herein.

In an embodiment, the keyboard sensing hardware structure formed under the sealed input surface may also include an active shielding layer which may be operatively coupled to one or more capacitive sensor microprocessors and PMU to be supplied a voltage level to shield the plurality of capacitive pad sensors from parasitic capacitance with a grounding source of the keyboard sensing hardware structure. In an embodiment, the plurality of capacitive pad sensors may be made of a deposited carbon layer that can detect capacitive changes from actuation of a keyboard key at a first capacitive change level, a touch of a human finger on a keyboard key at a second capacitive change level, and the presence of a human finger via a third level change in detected capacitance at the deposited carbon layers. Each of these capacitance change levels may be associated with a separate usage input mode in embodiments herein, including a key press measurement input mode triggered by detected capacitance change at the first or highest level, a touch input mode triggered by detected capacitance meeting the second or middle level, and a touchless gesture input mode triggered by detected capacitance meeting the third or lowest level. The key press measurement input mode may recognize user physical contact with one or more keys of the keyboard and application of downward pressure thereon. The touch input mode may recognize a user's touch physical contact without such downward pressure, and may be detected across multiple key groupings or surrounding grouped regions of capacitive sensor pads within the top sealed input surface of the base chassis of the information handling system. The touchless gesture input mode may recognize a user hand or portion thereof gesturing a distance above and detected across a different selection of multiple key groupings or surrounding grouped regions of capacitive sensor pads within the top sealed input surface of the base chassis of the information handling system, or even detected above the top surface of the display chassis of the information handling system when the information handling system is placed in a closed configuration.

The deposited carbon layers are operatively coupled via a flexible printed circuit board, a printed circuit board, or deposited carbon connector lines among other electrical couplings to the capacitive sensor microprocessor for detecting the one or more capacitive change levels associated with corresponding keyboard key or keys or their locations in one or more of a plurality of different removable tactile input layers, such as a removable tactile input layer keyboard structures, installed on the sealed input surface. The same keyboard sensing hardware structure formed under the sealed input surface may be used with one or more plural removable tactile input layers or keyboard structures installed on the sealed input surface according to embodiments herein.

In an embodiment, each of the plurality of capacitive pad sensors may be operatively coupled to a capacitive sensor microprocessor or to a plurality of capacitive sensor microprocessors executing machine readable code instructions of capacitive sensor drivers that can determine when various capacitive thresholds are reached that may indicate a current usage input mode, including the key press measurement input mode, the touch input mode, and the touchless gesture input mode. In an embodiment, each of the plurality of capacitive pad sensors may be operatively coupled to, for example, the capacitive sensor microprocessors via electrical traces formed on a surface such as a printed circuit board (PCB), a flexible PCB, or via one or more electrical traces deposited under and within the sealed input surface. These electrical sensor traces may be made of deposited silver, carbon, indium tin oxide, copper traces, or other electrical traces.

A capacitive sensor microprocessor may execute a capacitive sensor driver to sequentially scan a plural array of capacitive pad sensors, or to simultaneously read capacitance across a plurality of capacitive pad sensors grouped together into a capacitive change sensing region, based on the current usage input mode in embodiments herein. Embodiments of the present disclosure include a plurality of capacitive sensor microprocessors, each operatively coupled to and receiving user input from a plurality of capacitive pad sensors within the capacitive pads layer of the split keyboard structure. This capacitive sensor microprocessor or plurality of capacitive pad sensors in embodiments herein may scan capacitive pad sensors sequentially or serially for capacitive changes when it is desirable to distinguish between capacitive changes detected at individual capacitive pad sensors, such as when the information handling system is currently operating in a key press measurement input mode to detect distinct key presses at individual keys of the keyboard. This provides for a higher level of precision in detecting location of the user's finger at various points across the removable tactile input layer. In other embodiments herein, subgroups of the plurality of capacitive pad sensors may be scanned together simultaneously for capacitive changes when this level of granularity is not required, such as when the information handling system is currently operating in a touch input mode or a touchless gesture input mode, to decrease processing time for such detection and increase capacitance detection distance. User input received while in touch input mode may include, for example, a user drawing with a finger across a plurality of individual keys of the keyboard or across a portion of the bottom chassis of the information handling system situated to either side of a trackpad. User input received while in touchless gesture input mode may include, for example, a user gesturing with a hand or portion thereof above the surface of the removable tactile input layer when the chassis is in an open position, or above the lid of the chassis of the information handling system is in a closed position.

When operating in either the touch input mode or the touchless gesture input mode, and in order to decrease latency in detecting such user input across these areas, a host microprocessor, along with plural capacitive sensor microprocessors, may execute machine readable code instructions of a regional capacitive pad gesture sensing orchestration system to group subsets of the plurality of capacitive pad sensors together within capacitive change sensing regions, each comprising a bifurcated portion of the capacitive pads layer that corresponds to a bifurcated portion of the full surface area of the removable tactile input layer installed above the sealed input surface of the keyboard chassis. The host microprocessor may then execute machine readable code instructions of the regional capacitive pad gesture sensing orchestration system to orchestrate simultaneous detection of capacitive change across all capacitive pad sensors within each of these given subsets, to allow for simultaneous detection of capacitive change across these bifurcated portions of the full surface area of the removable tactile input layer depending on the usage input mode. This simultaneous sensing of capacitive change across the plurality of capacitive pad sensors may take less time than the sequential reading of each key individually and reduce latency of detected touch input or touchless gesture input. In embodiments herein, the host microprocessor may execute machine readable code instructions of the regional capacitive pad gesture sensing orchestration system to instruct simultaneous sensing of capacitive change across a larger plurality of capacitive pad sensors within one or more larger capacitive change sensing regions while operating in user touchless gesture input mode as compared to the touch input mode. This larger grouping of a plurality of capacitive pad sensors may decrease precision of detection by also result in increased distance above the capacitive pads layer at which such capacitive changes may be sensed above the surface of the removable tactile input layer. In other embodiments herein, the host microprocessor may execute machine readable code instructions of the regional capacitive pad gesture sensing orchestration system to instruct simultaneous sensing of capacitive change across a smaller plurality of capacitive pad sensors within one or more smaller capacitive change sensing regions while operating in user touch input mode, in order to detect smaller movements of the finger with greater resolution than that which is required for touchless gesture input mode. Finally, for key press measurement input mode, capacitive pad sensors corresponding to individual one or more keys of a removable tactile input layer may be sequentially scanned by each of one or more capacitive sensor microprocessors.

The host microprocessor may orchestrate such adaptable groupings of the plurality of capacitive pad sensors in embodiments herein by instructing the timing at which one or more capacitive sensor microprocessors operatively coupled to the plurality of capacitive pad sensors detects capacitive changes based on adjustments to scanning across those capacitive pad sensors. The host microprocessor may execute machine readable code instructions of the regional capacitive pad gesture sensing orchestration system to orchestrate simultaneous detection of capacitive change across one or more types of grouped subsets of the plurality of capacitive pad sensors in a given capacitive change sensing region in embodiments herein. The host microprocessor may execute machine readable code instructions of the regional capacitive pad gesture sensing orchestration system to instruct a single capacitive sensor microprocessor to simultaneously detect capacitive change across a plurality of operatively coupled capacitive pad sensors forming a capacitive change sensing region of the capacitive pads layer, if all capacitive pad sensors within that capacitive change sensing region are operatively coupled to that single capacitive sensor microprocessor. In other embodiments, the host microprocessor may execute machine readable code instructions of the regional capacitive pad gesture sensing orchestration system to instruct a plurality of capacitive sensor microprocessors to scan varying sized groups of capacitive pad sensors adjusted for input mode where the grouped capacitive pad sensors are each operatively coupled to one or more of the capacitive pad sensors and currently grouped together within a capacitive change sensing region of a capacitive pads layer to simultaneously detect capacitive change. The number of the plurality of capacitive pad sensors in a capacitive change sensing region is dynamically adjusted for various input mode including key press measurement input mode, touch input mode, gesture input mode or even a palm sensing input mode, and may determine the how far total capacitive change across that capacitive change sensing region may be sensed based on using multiple received inputs from the plurality of capacitive pad sensors at those capacitive sensor microprocessors.

The host microprocessor executing machine readable code instructions of the regional capacitive pad gesture sensing orchestration system in embodiments herein may group the plurality of capacitive pad sensors into subgroups situated within distinct capacitive change sensing regions based on the current usage mode, or upon a user preference for greater speed and sensing distance or greater precision of detecting user inputs for each of these usage input modes. For example, each of the usage input modes may be associated with an initial or default assignment of each of the plurality of capacitive pad sensors into various-sized groups of capacitive pad sensors within capacitive change sensing regions in an embodiment. For example, the touchless gesture input mode or the palm detection input mode are associated with the largest grouping of capacitive pad sensors for capacitive change sensing regions that include a greater number of capacitive pad sensors allowing for greater distance of capacitive sensing but less precision in detection of an input. The touch input mode is associated with smaller capacitive change sensing regions including smaller numbers of capacitive pad sensors. The key press measurement input mode may operate the plurality of capacitive pad sensors to detect corresponding keys that correlate to each of those capacitive pad sensors in another embodiment.

A user may adjust the size of these capacitive change sensing regions and the frequency with which the capacitive changes are sensed within these capacitive change sensing regions during various usage input modes in embodiments herein via a graphical user interface (GUI) of the regional capacitive pad gesture sensing orchestration system. For example, a user may wish to increase resolution of detected touch input when in touch input mode. In such a scenario, the host microprocessor executing machine readable code instructions of the regional capacitive pad gesture sensing orchestration system may decrease the number of capacitive pad sensors assigned to a grouping for a given capacitive change sensing region to allow for increased resolution in detecting smaller movements of the user's hand or finger across shorter distances of the removable tactile input layer in each usage input mode. As another example, a user may wish to increase a distance above the surface of the removable tactile input layer at which a touchless gesture input (or greater detection of a touch gesture input) may be detected. In such a scenario, the host microprocessor executing machine readable code instructions of the regional capacitive pad gesture sensing orchestration system may increase the number of capacitive pad sensors assigned to a given capacitive change sensing region, because the distance at which capacitive change may be sensed is proportional to the area or size of the capacitive change sensing region across which such a capacitive change may be sensed. As yet another example, a user may wish to decrease latency in detecting user touch input or touchless gesture input. In such a scenario, the host microprocessor executing machine readable code instructions of the regional capacitive pad gesture sensing orchestration system may increase the number of capacitive pad sensors assigned to a given capacitive change sensing region for one or more usage input modes, to decrease sensing time by simultaneously sensing capacitance across a larger plurality of capacitive pad sensors, rather than scanning each capacitive pad sensor sequentially. In such a way, the host microprocessor operatively coupled to each of a plurality of capacitive sensor microprocessors may execute machine readable code instructions of the regional capacitive pad gesture sensing orchestration system to adjustably group capacitive sensing pads into capacitive change sensing regions of the removable tactile input layer based upon user instruction and current usage input mode.

In some embodiments, capacitive sensor microprocessors may execute machine readable code instructions of the regional capacitive pad gesture sensing orchestration system may automatically adjust groupings of capacitive pad sensors in the capacitive change sensing regions as the user engages the information handling system. For example, a first large grouping of capacitive pad sensors for a capacitive change sensing region may be used to detect a user's palm approaching a removable tactile input layer in a palm detection input mode and, once detected, may trigger a second usage input mode. The second usage input mode may include a touchless gesture input mode with a second sized grouping of capacitive pad sensors in a second defined capacitive change sensing region that may be used to detect a user's finger or hand for touchless gestures above the removable tactile input layer (e.g., keyboard keys or palmrest area). If no gestures are received or a gesture indicates a user's touch of keyboard keys, a third usage input mode may be triggered to include a touchless gesture input mode with a third, smaller sized grouping of capacitive pad sensors in a third defined capacitive change sensing region that may be used to detect a user's finger touch gesture on keyboard keys or a touch area of the removable tactile input layer in an embodiment. If no gestures are received or a gesture indicates a user's keypress of a keyboard key, a fourth usage input mode may be triggered to include scanning each of the capacitive pad sensors to detect one or more keypress actuations of the keyboard keys of the removable tactile input layer in another embodiment.

Turning now to the figures, FIG. 1 illustrates an information handling system 100 similar to the information handling systems according to several aspects of the present disclosure. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP) 134, a base station transceiver 135, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a client computer in a server-client network environment, or as a peer computer system in a peer-to-peer (or distributed) network environment. In an embodiment, the information handling system 100 may be implemented using electronic devices that provide voice, video, or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or plural sets, of instructions to perform one or more computer functions.

The information handling system 100 may include main memory 112, (volatile (e.g., random-access memory, etc.), or static memory 114, nonvolatile (read-only memory, flash memory etc.) or any combination thereof), one or more hardware processing resources, such as a hardware processor 102 that may be a central processing unit (CPU), embedded controller (EC) 104, a graphics processing unit (GPU) 106, a neural processing unit (NPU) 110, an accelerated processing unit (APU) 108, other types of hardware processing devices, or any combination thereof. It is appreciated that the information handling system 100 may include any number of hardware processing devices described herein. Computer readable code instructions stored in main memory 112 (e.g., RAM) may be accessible by hardware processing resources using that main memory 112. Machine readable code instructions stored in non-transitory machine readable storage medium of static memory 114, main memory 112, or drive unit 126 and may be involved in invoking such machine readable code instructions to main memory 112 for execution by a hardware processor according to embodiments herein. Additional components of the information handling system 100 may include one or more storage devices such as static memory 114 or drive unit 126. The information handling system 100 may include or interface with one or more communications ports for communicating with external devices, as well as various wired or wireless input and output (I/O) devices 150, such as a mouse 154, a trackpad 153, a stylus 152, a split-keyboard structure 156, a video/graphics display device 151, a microphone 155, or any combination thereof. Further, various wired or wireless input and output (I/O) devices 150, such as a microphone 155, speaker, a trackpad 153, a stylus 152, a split-keyboard structure 156, a video/graphics display device 151, mouse 154, or any combination thereof may be integrated into the chassis of the information handling system 100 in other embodiments. A split-keyboard structure 156 may be formed with keyboard keys in a removable tactile input layer 160 having one or more keyboard layouts or I/O structure layouts such as a touch surface according to various embodiments of the present disclosure. Portions of an information handling system 100 may themselves be considered information handling systems 100.

Information handling system 100 may include devices or modules that embody one or more of the devices or execute instructions for one or more systems and modules. The information handling system 100 may execute machine readable code instructions (e.g., software algorithms) parameters, and profiles 118 that may operate on servers or systems, remote data centers, or on-box in individual client information handling systems according to various embodiments herein. In some embodiments, it is understood any or all portions of machine readable code instructions (e.g., software algorithms) parameters, and profiles 118 may operate on a plurality of information handling systems 100.

The information handling system 100 may include the hardware processor 102 such as a central processing unit (CPU) or other hardware processing resources (e.g., 104, 106, 108, 110). Any of the hardware processing resources may operate to execute computer readable code instructions that are either firmware or software code, such as those software systems and modules described herein. Moreover, the information handling system 100 may include memory such as main memory 112, static memory 114, and disk drive unit 126 (volatile (e.g., random-access memory, etc.), nonvolatile memory (read-only memory, flash memory etc.) or any combination thereof or other memory with non-transitory computer readable medium 116 storing machine readable code instructions (e.g., software algorithms) parameters, and profiles 118 executable by the hardware processor 102 (e.g., central processing unit), NPU 110, APU 108, EC 104, GPU 106, or any other hardware processing device. The information handling system 100 may also include one or more buses 124 operable to transmit communications between the various hardware components such as any combination of various wired or wireless I/O devices 150 as well as between hardware processors 102, an EC 104, the operating system (OS) 122, the basic input/output system (BIOS) 120, the wireless interface adapter 130, or a radio module, among other components described herein. In an embodiment, the hardware processor 102, EC 104, GPU 106, NPU 110, APU 108, and/or others may execute one or more bus drivers in order to transmit this data between the information handling system 100 and the wired or wireless input/output devices 150 described herein. In an embodiment, the information handling system 100 may be in wired or wireless communication with the wired or wireless I/O devices 150 such as a split-keyboard structure 156 of embodiments herein, a mouse 154, video/graphics display device 151, stylus 152, trackpad 153, microphone 155, or speaker among other peripheral devices.

As described herein, the information handling system 100 further includes a video/graphics display device 151. The video/graphics display device 151 in an embodiment may function as a liquid crystal display (LCD), an organic light emitting diode (OLED), a flat panel display, or a solid-state display. It is appreciated that the video/graphics display device 151 may be wired or wireless and may be an external video/graphics display device 151 that allows a user to increase the desktop area by extending the desktop in an embodiment. Additionally, as described herein, the information handling system 100 may include or be operatively coupled to a cursor control device (e.g., a trackpad 153, or gesture or touch screen input), a stylus 152, and/or a split-keyboard structure 156, among others that allows the user to interface with the information handling system 100 via the video/graphics display device 151. Information handling system 100 may also be operatively coupled to a wired or wireless input/output device 150 or other hardware devices that may include a hardware processing device such as a hardware processor, microcontroller, or other hardware processing resource. Various drivers and hardware control device electronics may be operatively coupled to operate the wired or wireless I/O devices 150 according to the embodiments described herein.

A network interface device of the information handling system 100 may be wired or wireless such as shown with wireless interface adapter 130 that can provide wireless connectivity among devices such as with Bluetooth® or to a network 136, e.g., a wide area network (WAN), a local area network (LAN), wireless local area network (WLAN), a wireless personal area network (WPAN), a wireless wide area network (WWAN), or other network. In embodiments described herein, the wireless interface device 130 with its radio 131, RF front end 132 and antenna 133 is used to communicate with the wireless peripheral devices, via, for example, a Bluetooth® or Bluetooth® Low Energy (BLE) protocols or any proprietary RF protocol such as those may utilize similar frequency ranges but proprietary modulation and data transmission characteristics. In embodiments, Bluetooth®, BLE, proprietary RF protocol, or other WPAN or WLAN protocols and plural such protocols may be used for communication with and among any wireless peripheral device to be paired or paired with the information handling system 100 or other information handling systems.

In other embodiments, a WAN, WWAN, LAN, and WLAN may each include an AP 134 or base station 135 used to operatively couple the information handling system 100 to a network 136 via a wireless interface adapter 130. In a specific embodiment, the network 136 may include macro-cellular connections via one or more base stations 135 or a wireless AP 134 (e.g., Wi-Fi), or such as through licensed or unlicensed WWAN small cell base stations 135. Connectivity may be via wired or wireless connection. For example, wireless network wireless APs 134 or base stations 135 may be operatively connected to the information handling system 100. Wireless interface adapter 130 may include one or more Radio Frequency (RF) subsystems (e.g., radio 131) with transmitter/receiver circuitry, modem circuitry, one or more antenna Radio Frequency (RF) front end 132 circuits, one or more wireless controller circuits, amplifiers, antennas 133 and other circuitry of the radio 131 such as one or more antenna ports used for wireless communications via multiple radio access technologies (RATs). The radio 131 may communicate with one or more wireless technology protocols.

In an embodiment, the wireless interface adapter 130 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, proprietary RF protocol, or similar wireless standards may be used. Wireless interface adapter 130 may connect to any combination of macro-cellular wireless connections including 2G, 2.5G, 3G, 4G, 5G or the like from one or more service providers. Utilization of RF communication bands according to several example embodiments of the present disclosure may include bands used with the WLAN standards and WWAN carriers which may operate in both licensed and unlicensed spectrums. The wireless interface adapter 130 can represent an add-in card, wireless network interface module that is integrated with a main board of the information handling system 100 or integrated with another wireless network interface capability, or any combination thereof.

In some embodiments, a hardware processing resource executes machine readable code instructions of software or firmware to implement one or more of some systems and methods described herein, or dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware devices with related control and data signals that may be communicated between and through the modules, or as portions of an application-specific integrated circuit. Accordingly, the present system encompasses a hardware processing resource executing machine readable code instructions of software or firmware as well as hardware implementations or any combination.

In accordance with various embodiments of the present disclosure, the methods described herein may be implemented by firmware or software programs executable by a hardware controller or a hardware processor system. Further, in an exemplary, non-limited embodiment, implementations may include distributed hardware processing, component/object distributed hardware processing, and parallel hardware processing. Alternatively, virtual computer system processing may be constructed to implement one or more of the methods or functionalities as described herein.

The present disclosure contemplates a non-transitory computer-readable medium that includes machine readable code instructions, parameters, and profiles 118 or that receives and executes machine readable code instructions, parameters, and profiles 118 stored in a non-transitory computer-readable medium that is responsive to a propagated signal, so that a hardware device connected to a network 136 may communicate voice, video, or data over the network 136. Further, the machine readable code instructions, parameters, and profiles 118 may be transmitted or received over the network 136 via the network interface device or wireless interface adapter 130 in some embodiments.

The information handling system 100 may include a set of machine readable code instructions, parameters, and profiles 118 that may be executed to cause the computer system to perform any one or more of the methods or computer-based functions disclosed herein. For example, machine readable code instructions, parameters, and profiles 118 may be executed by a hardware processor 102, GPU 106, EC 104, APU 108, NPU 110, or any other hardware processing resource and may execute software applications, agents, firmware, or other aspects or components used to execute the methods and systems described herein. Various software modules comprising application machine readable code instructions, parameters, and profiles 118 may be coordinated by an operating system (OS) 122, and/or via an application programming interface (API) include a unified device API described herein. An example OS 122 may include Windows®, Android®, and other OS types. Example APIs may include Win 32, Core Java API, or Android APIs.

In an embodiment, the information handling system 100 may include a disk drive unit 126. The disk drive unit 126 and may include machine-readable program code instructions, parameters, and profiles 118 in which one or more sets of machine-readable program code instructions, parameters, and profiles 118 such as firmware or software can be embedded to be executed by the hardware processor 102 (e.g., CPU) or other hardware processing devices such as a GPU 106, an EC 104, an NPU 110, an APU 108, or other hardware processing resource device to perform the processes described herein. Similarly, main memory 112 and static memory 114 may also contain a non-transitory computer-readable medium for storage of one or more sets of machine-readable program code instructions, parameters, or profiles 118 described herein. The disk drive unit 126 or static memory 114 also contain space for data storage. Further, the machine-readable program code instructions, parameters, and profiles 118 may embody one or more of the methods as described herein. In a particular embodiment, the machine-readable program code instructions, parameters, and profiles 118 may reside completely, or at least partially, within non-transitory computer readable medium of the main memory 112, the static memory 114, and/or within the disk drive 126 during execution by the hardware processor 102, EC 104, APU 108, NPU 100, or GPU 106 of information handling system 100.

Main memory 112 or other memory of the embodiments described herein may contain non-transitory computer-readable medium (not shown), such as RAM in an example embodiment. An example of main memory 112 includes random access memory (RAM) such as static RAM (SRAM), dynamic RAM (DRAM), non-volatile RAM (NV-RAM), or the like, read only memory (ROM), another type of memory, or a combination thereof. Static memory 114 may contain non-transitory computer-readable medium (not shown), such as NOR or NAND flash memory in some example embodiments. The applications and associated APIs, for example, may be stored in static memory 114 or on the disk drive unit 126 that may include access to a machine-readable code instructions, parameters, and profiles 118 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a processor or that cause a computer system to perform any one or more of the methods or operations disclosed herein.

In an embodiment, the information handling system 100 may further include a power management unit (PMU) 127 (a.k.a. a power supply unit (PSU)). The PMU 127 may include a hardware controller and executable machine-readable code instructions to manage the power provided to the components of the information handling system 100 such as the hardware processor 102 and other hardware components described herein. The PMU 127 may control power to one or more components including the one or more drive units 126, the hardware processor 102 (e.g., CPU), the EC 104, the GPU 106, the APU 108, the NPU 110, a video/graphic display device 151, or other wired or wireless I/O devices 150 such as the mouse 154, the stylus 152, the split-keyboard structure 156, microphone 155, and the trackpad 153 and other components that may require power when a power button has been actuated by a user. In an embodiment, the PMU 127 may monitor power levels and power may be electrically coupled to the information handling system 100 via various ports in embodiments herein to provide this power. The PMU 127 may be coupled to the bus 124 to provide or receive data or machine-readable code instructions. The PMU 127 may regulate power from a power source such as the battery 128, or AC power adapter 129 such as from one or more ports. In an embodiment, the battery 128 may be charged via the AC power adapter 129 and provide power to the components of the information handling system 100 when AC power from the AC power adapter 129 is removed.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium 116 can store information received from distributed network resources such as from a cloud-based environment. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses hardware resources executing software or firmware, as well as hardware implementations.

As described herein, the information handling system 100 may include a split-keyboard structure 156 used by a user to provide keypress, touch, or touchless gesture input to the information handling system 100 according to various embodiments. In the context of the present specification, the information handling system 100 may be a laptop-type information handling system 100 that includes a base portion and a lid portion. A housing of the lid portion or display chassis, in an embodiment, may house the video/graphics display device 151 described herein. The base portion, also referred to as a base chassis or keyboard chassis, may be where the split-keyboard structure 156 is placed giving the user the ability to provide input to the information handling system 100. The base chassis or keyboard chassis in embodiments may also house one or information handling system hardware components such as those described in accordance with FIG. 1.

The split-keyboard structure 156 may have a split split-keyboard structure 156 that includes a removable tactile input layer 160 installed on a sealed input surface 161 of the base chassis or keyboard chassis, and is independent of a keyboard sensing hardware structure 162 formed under the sealed input surface 161 in embodiments herein. The sealed input surface 161 operates as a sealed, top surface housing for a base chassis or other chassis of information handling system 100. In other embodiments, the sealed input surface 161 may serve as a sealed top surface of a keyboard chassis for an independent keyboard structure. The removable tactile input layer 160 may be that layer that a user interacts with to provide input that is contactlessly detected by the keyboard sensing hardware structure 162 formed under a sealed input surface 161 of the chassis for the information handling system 100. This removable tactile input layer 160 may include only mechanical elements such as mechanical keyboard keys that provide tactile response to the user when the mechanical keyboard keys or other I/O interface structures such as touch areas are pressed or touched. The removable tactile input layer 160 may not have any associated electronics and a user's finger or movement of mechanical keyboard keys may affect capacitance detected in the keyboard sensing hardware structure 162 formed under a sealed input surface 161 such as with a capacitive pads layer 163 in embodiments herein. In a specific example, the removable tactile input layer 160 may include a keycap operatively coupled to a rubber dome or popple forming a mechanical keyboard key among a plurality of mechanical keyboard keys formed in a tray, grid or other support structure formed of a suitable material.

Plural removable tactile input layers 160 with various keyboard structure layouts may be installed and operated with the keyboard sensing hardware structure 162 formed under the sealed input surface 161 of the chassis of information handling system 100 in embodiments herein. In this example embodiment, instead of the rubber dome having a switch or activating a switch on a printed circuit board (PCB), the keycap and rubber dome may be used to help provide location of a key in the removable tactile input layer and over the keyboard sensing hardware structure 162 formed under the sealed input surface 161 as well as provide tactile feedback to the user. The location of corresponding capacitive sensing pads in capacitive sensing pads layer 163 may correspond to keyboard keys when a keyboard removable tactile input layer 160 is installed on top of the sealed input surface 161. No physical engagement with keypress sensing electronics is required in the removable tactile input layer 160 and, accordingly, the removable tactile input layer 160 is easily removable and replaceable for any of a plurality of removable tactile input layers 160 that can be replaced and used with the keyboard sensing hardware structure 162 formed under the sealed input surface 161. In this example embodiment, the removable tactile input layer 160 may also include scissor or butterfly arms that also provide tactile feedback to the user while facilitating the recoil of the keycap upwards for tactile feedback of a keypress to a user. However, the removable tactile input layer 160 does not include any electrical elements that are used to receive electrical signals as the user presses the keys. Therefore, in the embodiments herein, the removable tactile input layer 160 does not include a PCB layer, a flexible PCB layer, or other electrical components that other keyboards may use to detect the press of a key by the user. Instead, in the embodiments herein, the split-keyboard structure 156 includes the keyboard sensing hardware structure 162 formed under the sealed input surface 161 where those keypress strokes of the keys on the removable tactile input layer 160 are capacitively detected, thus contactlessly sensed.

The keyboard sensing hardware structure 162 formed under the sealed input surface 161 may include a plurality of layers used to detect those keypress keystrokes during actuation of keyboard keys on the removable tactile input layer 160 of the split-keyboard structure 156 above the sealed input surface 161. In an embodiment, the sealed input surface 161 may be sealed such that liquids, dust, and other contaminants cannot enter into the base portion of the information handling system 100. This prevents those contaminants from damaging those hardware elements formed into the housing of the base portion of the information handling system 100.

In an example embodiment, the keyboard sensing hardware structure 162 formed under the sealed input surface 161 may include a capacitive pads layer 163. The capacitive pads layer 163 includes a plurality of capacitive pad sensors that may correspond to keyboard keys in the removable tactile input layer 160 to detect capacitive changes due to actuation of those keyboard keys of the removable tactile input layer 160 above the sealed input surface 161 of the chassis of the information handling system. Further, the capacitive pads layer 163 includes a plurality of capacitive pad sensors to detect capacitive changes due to touch input by a user's fingers on keys or I/O structures on the removable tactile input layer in an embodiment. In yet another embodiment, the capacitive pads layer 163 may include the plurality of capacitive pad sensors that may detect capacitive changes due to sensing proximate location of the user's body part, including fingers or hand for a touchless gesture, above those keyboard keys of the removable tactile input layer 160 and above the sealed input surface 161 of the chassis of the information handling system.

In an embodiment, these capacitive pad sensors may be made of deposited carbon pads which may be delicate, but are protected and sealed under the sealed input surface 161 of the chassis of the information handling system 100 for the keyboard sensing hardware structure 162. The deposited carbon capacitive sensing pads of the capacitive pads layer have a benefit of very low cost and simple manufacturing via deposition or masked spraying to form these deposited carbon capacitive sensing pads. In an embodiment, these capacitive sensing pads of deposited carbon may be configured to vary an electric field in response to changes in nearby capacitance. These carbon-based patches may be arranged in a sensor matrix of capacitive sensing pads and may be printed, sputtered, or otherwise deposited on a non-conductive substrate such as an ABS polymer surface such as the underside of the sealed input surface 161 or on a PCB or flexible PCB at very low cost. In an embodiment, the array of deposited carbon patches for the capacitive sensing pads in the capacitive pads layer 163 may be arranged such that each keyboard key of the removable tactile input layer 160 aligns vertically over the sealed input surface 161 with a deposited carbon patch capacitive sensing pads of the keyboard sensing hardware structure 162 formed under the sealed input surface 161 in embodiments herein.

In an embodiment, each of the plurality of capacitive pad sensors in the capacitive pads layer 163 may be operatively coupled to a capacitive sensor microprocessor 167 executing machine readable code instructions of a capacitive sensor driver 166. In an embodiment, each of the carbon capacitive sensing pads that form the plurality of capacitive sensors of the capacitive pads layer 163 may be operatively coupled to a capacitive sensor microprocessor 167 via carbon or other conductive traces formed on a surface such as a printed circuit board (PCB) or a flexible PCB or on an ABS surface, or some combination in embodiments described herein. It is also appreciated that other types of traces may be formed to operatively couple the carbon pads to the capacitive sensor microprocessor 167 executing machine readable code instructions of the capacitive sensor driver 166 such as silver, copper traces or indium tin oxide (ITO) that allow each of the carbon pads to conduct signals to the capacitive sensor driver 166. One or more capacitive sensor microprocessors 167 executing one or more capacitive sensor drivers 166 may operate according to embodiments herein for determination of a particular keyboard key keypress, determination of a user's touch input, or determination of a user's touchless gesture input at or near the keys or other input/output surfaces the removable tactile input layer 160 for the split-keyboard structure 156. As described in embodiments herein, touch or touchless gestures on the keys or other input/output surfaces may involve movement of a user's finger or hand across plural locations and that movement sensed by a plurality of capacitive pad sensors or a defined grouped plurality of capacitive pad sensors in variously-sized and adjustable capacitive change sensing regions according to embodiments herein. One or more capacitive sensor drivers 166 may be executed by one or more capacitive sensor microprocessors 167 to detect and determine which of the plurality of keys on the removable tactile input layer 160 have been pressed, touched or hovered above in various usage input modes and detected at each of the plurality of capacitive pad sensors based on location and a detected level of capacitance change. Depending on the usage mode detected or determined, the size of the defined grouping of capacitive pad sensors for capacitive change sensing regions or individual scanning of the capacitive pad sensor may be automatically adjusted among by the one or more capacitive sensor drivers 166 executed by the one or more capacitive sensor microprocessors 167 during execution of the region capacitive pad gesture sensing orchestration system 149 according to embodiments herein. For example, the capacitive sensor microprocessor 167 executing the machine readable code instructions of the capacitive sensor driver 166 may relay keypress inputs detected from at least one capacitive sensing pad using serial scanning by the capacitive sensor microprocessor 167 to the hardware processor 102 for processing of a keystroke as input to the information handling system 100 in embodiments herein.

As described in a particular embodiment herein, a plurality of capacitive sensor microprocessors, such as 167, are each operatively coupled to and receive touch input or touchless gesture input from adjustable subgroupings of the plurality of capacitive pad sensors as variable sized capacitive change sensing regions within the capacitive pads layer 163 of the split keyboard structure 156. These variable sized capacitive change sensing regions of the capacitive pads layer 163 correspond to areas or regions above the sealed input surface 161 on an installed removable tactile input layer 160. These variable capacitive change sensing regions of grouped capacitive pad sensors may allow for simultaneous and rapid reading of capacitive pad sensors across multiple designated subgroups corresponding to portions of the removable tactile input layer 160 to flexibly detect user touch input and user touchless gesture input with less latency, with greater capacitive sensing distance, or with higher detection acuity across shorter distances of the removable tactile input layer 160 than in structures employing a single capacitive sensor microprocessor 167 serially scanning all of the capacitive pad sensors in a capacitive pad sensor layer 163 across an entire sealed input surface 161. Each of the plurality of capacitive sensor microprocessors 167 in various embodiments herein may be operatively coupled to a host microprocessor 168 executing machine readable code instructions of a regional capacitive pad gesture sensing orchestration system 149 to detect a user touch gesture input or hover gesture input based on sensed capacitive changes received from different sub-grouped sizes of a plurality of capacitive sensor pads by each of a plurality of the capacitive sensor microprocessors 167 in various defined capacitive change sensing regions for each usage input mode. Those designated capacitive pad sensor subgroupings associate those detected capacitive changes across plural capacitive pad sensors under plural portions of the removable tactile input layer 160 with a user touch input mode or touchless gesture input mode. These plural portions of the removable tactile input layer 160 associated with different capacitive pad subgroups are referred to as user capacitive change sensing regions. For example, the host microprocessor 168 executing machine readable code instructions of a regional capacitive pad gesture sensing orchestration system 149 may receive input of capacitive changes at two capacitive pad sensors having different capacitive pad subgroup locations under the removable tactile input layer 160 and associate those capacitive changes with a user touch or touchless gesture input of a swiping motion from the position of the first capacitive pad sensor to the position of the second capacitive pad sensor and across capacitive change sensing regions of the removable tactile input layer 160. In other embodiments, the host microprocessor 168 executing machine readable code instructions of a regional capacitive pad gesture sensing orchestration system 149 may adjust the capacitive sensor microprocessor or microprocessors 167 to serially scan each capacitive sensor pad of a capacitive pads layer 163 when key press inputs are detected in a key press measurement input mode. In this latter key press measurement input mode, subgroupings of capacitive pad sensors for each capacitive sensor microprocessor 167 may be eliminated to detect corresponding keys of a keyboard of the removable tactile input layer 160 being used by a user.

In an embodiment, the keyboard sensing hardware structure 162 formed under the sealed input surface 161 may include an active shielding layer 164 to shield the plurality of capacitive sensors within the capacitive pads layer 163 from a grounding layer 165 serving as an electromagnetic interference (EMI) and grounding for the split-keyboard structure 156. The grounding layer 165 along with the active shielding layer 164 may act as a controlled return path for noise from the information handling system components and external EMI that would otherwise disrupt the operation of the plurality of capacitive pad sensors of the capacitive pads layer 163. In an embodiment, the active shielding layer 164 may be operatively coupled to a voltage source as controlled by the capacitive sensing microcontroller 167 such that the voltage level of the active shielding in the active shielding layer 164 is held at about that of the capacitive sensing pads of the capacitive pads layer 163 to prevent grounding of the capacitive sensing pads by the grounding layer 165. This grounding layer 165 is used for split-keyboard structure 156 grounding and EMI and noise shielding, but due to the thin profile of the keyboard sensing hardware structure 162 formed under the sealed input surface 161, is potentially close to the capacitive sensing layer 163 and may disrupt the operation of the plurality of capacitive pad sensors (e.g., carbon pads) within the capacitive pads layer 163 via parasitically grounding capacitance of those capacitive sensing pads from detecting other capacitive changes due to user inputs. This active shielding layer 164 may be driven using the same voltage as the plurality of capacitive pad sensors within the capacitive pads layer 163 in some embodiments. This reduces parasitic capacitance between the plurality of capacitive pad sensors of the capacitive pads layer 163 and the grounding layer 165 placed below the active shielding layer 164. Thus, the active shielding layer 164 improves signal-to-noise ratio and extends capacitive sensing range of the plurality of capacitive pad sensors of the capacitive pads layer 163 in the keyboard sensing hardware structure 162 formed under the sealed input surface 161.

In an embodiment, the keyboard sensing hardware structure 162 formed under the sealed input surface 161 may also include the grounding layer 165. The grounding layer 165 may also prevent EMI interference with the plurality of capacitive pad sensors within the capacitive pads layer 163 from hardware components in the chassis, such as the base chassis, of the information handling system 100. The grounding layer 165 may also absorb or redirect stray capacitive coupling or leakage current that might affect signal precision at the plurality of capacitive pad sensors as well as serve as a safety grounding source for the electronic components of the split-keyboard structure 156. In an embodiment, the grounding layer 165 may provide a stable electrical reference for the active circuitry of the keyboard sensing hardware structure 162 formed under the sealed input surface 161 and help to define signal baseline at the plurality of capacitive sensors. It is appreciated that other hardware components of the information handling system 100 may be placed below the ground layer 165 that may include an information handling system hardware mainboard that may house the hardware processor 102, other processing devices (e.g., 104, 106, 108, 110), the PMU 128, the wireless interface adapter 130, the radio 131, the RF front end 132, and the antenna 133 among other hardware components. Thus, the grounding layer 165 may prevent any EMI and noise from those hardware components also from affecting the operation of the capacitive pads layer 163 as described herein.

The systems and methods described herein, therefore, provides for a split-keyboard structure 156 that can operate even when contaminants are accidentally introduced into the removable tactile input layer 160 such as liquids. If damaged, the mechanical keyboard keys of the removable tactile input layer 160 may be removed and replaced with another removable tactile input layer 160 for use with the keyboard sensing hardware structure 162 formed under the sealed input surface 161 and without replacement of the electronics for sensing keypress, touch, and touchless gesture inputs in embodiments herein. By bifurcating the split-keyboard structure 156 into a purely mechanical removable tactile input layer 160 and the keyboard sensing hardware structure 162 formed under the sealed input surface 161, damage to the split-keyboard structure 156 can be limited, from a spill for example, to the removable tactile input layer 160. The electronic devices of the keyboard sensing hardware structure 162 formed under the sealed input surface 161 in split-keyboard structure 156 and the hardware components of the information handling system 100 remain sealed within the sealed input surface 161 protected from damage. Still further, the split-keyboard structure 156 of the present specification also provides for a swappable removable tactile input layer 160 that allows for repair or replacement of the removable tactile input layer 160 if and when contaminants have been introduced into the mechanical parts of the removable tactile input layer 160. Even further, the split-keyboard structure 156 of the present specification also provides for a swappable removable tactile input layer 160 that accommodates for different types of keyboard layouts thereby accommodating for various typists who are using the information handling system 100. Because of the layout of the various layers of the split-keyboard structure 156, the split-keyboard structure 156 may not only operate with the keyboard sensing hardware structure 162 formed under the sealed input surface 161 to recognize tactile input such as a keypress or touch input at the removable tactile input layer 160, but may also recognize when a user's fingers are hovering over the keys of the split-keyboard structure 156 and above those keys in a touchless gesture function. This allows for touchless gestures as well as touch inputs and keypresses to be received at the split-keyboard structure 156 sensed by contactless capacitive sensing with the keyboard sensing hardware structure 162 formed under the sealed input surface 161. Touch input and touchless gestures may include swiping gestures and the like in order to provide various different types of input at the removable tactile input layer 160 of the split-keyboard structure 156 than other keyboards may be capable of receiving.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a standalone device). The system, device, controller, or module can include hardware processing resources executing software, including firmware embedded at a device, such as an Intel® brand processor, AMD® brand processors, Qualcomm® brand processors, or other processors and chipsets, or other such hardware device capable of operating a relevant software environment of the information handling system. The system, device, controller, or module can also include a combination of the foregoing examples of hardware or hardware executing software or firmware. Note that an information handling system can include an integrated circuit or a board-level product having portions thereof that can also be any combination of hardware and hardware executing software. Devices, modules, hardware resources, or hardware controllers that are in communication with one another need not be in continuous communication with each other, unless expressly specified otherwise. In addition, devices, modules, hardware resources, and hardware controllers that are in communication with one another can communicate directly or indirectly through one or more intermediaries.

Figure 2A:
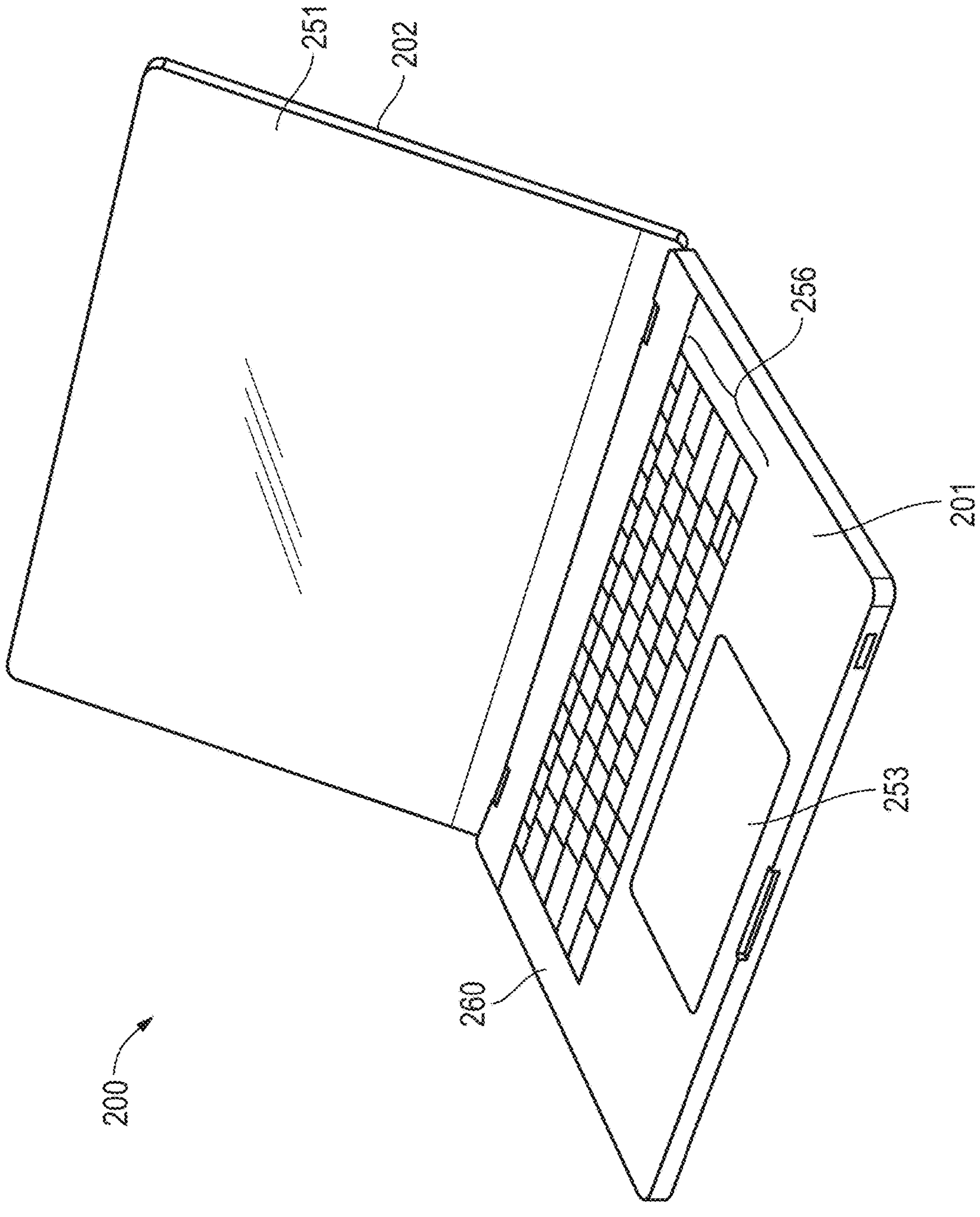
FIG. 2A is a graphic diagram illustrating an information handling system that includes a split keyboard structure having a separate removable tactile input layer and a sealed input surface having a keyboard sensing hardware structure formed under the sealed input surface to receive keyboard, touch and gesture input from a user according to an embodiment of the present disclosure.

FIG. 2A is a graphic diagram illustrating an information handling system 200 that includes a split-keyboard structure having a removable tactile input layer and a separate keyboard sensing hardware structure formed under a sealed input surface to receive keyboard, touch and gesture input contactlessly at capacitive pad sensors from a user according to an embodiment of the present disclosure. As described herein, the information handling system 200 may be a laptop-type information handling system 200. The laptop-type information handling system 200 may include a base chassis 201 and a display chassis 202. Therefore, FIG. 2A shows a lid portion of the laptop-type information handling system 200 that is a display chassis 202 that includes a video/graphics display device 250 to provide output to the user and for the user to provide input in those embodiments where the video/graphics display device 250 is a touchscreen display device. The laptop-type information handling system 200 also includes a base chassis 201, hinged to the display chassis 202, that may house information handling system hardware components as described in connection with FIG. 1 as well as various ports. The base chassis 201 in various embodiments further includes the separate keyboard sensing hardware structure formed under a sealed input surface (not shown) of the base chassis 201 and have a separate, mechanical, removable tactile input layer 260 installed on top of the sealed input surface of the base chassis 201 according to embodiments herein.

In an embodiment, the base portion 201 of the laptop-type information handling system 200 may include the keyboard structure 256 in the removable tactile input layer 260 forming a first portion of the split-keyboard structure as described in embodiments herein. FIG. 2A shows the removable tactile input layer 260 that has been coupled to or otherwise installed to a sealed input surface (not shown) as described in connection with FIG. 1.

FIG. 2A also shows a trackpad 256 installed in the base portion of the laptop-type information handling system 200. This trackpad 253 may also be used by the user to provide input to the information handling system 200. In an embodiment, the trackpad 253 may form part of the removable tactile input layer 260 and may operate similarly to those keyboard keys present within the keyboard structure 256 of the removable tactile input layer 260 and be contactlessly detected by the separate keyboard sensing hardware structure formed under a sealed input surface in some embodiments. Alternatively, the trackpad 253 may form a different part of the top layer of the base chassis 201 of the information handling system 200 and may operate independently of the keyboard structure 256 that forms the removable tactile input layer 260. In the latter embodiment, the trackpad 253 operates to receive touch and clicks at the surface of the trackpad 253 with the trackpad 253 and includes trackpad electrical circuits to receive that input separate from the keyboard sensing hardware structure formed under a sealed input surface to receive keyboard, touch and gesture input contactlessly at capacitive pad sensors from a user in the keyboard structure 256 or other structure of the removable tactile input layer 260.

As described herein, a capacitive sensor microprocessor in an embodiment may execute a capacitive sensor driver to sequentially scan a plural array of capacitive pad sensors disposed beneath the removable tactile input layer 260, or to simultaneously read capacitance across a plurality of capacitive pad sensors grouped together into one of a plurality of capacitive change sensing regions disposed beneath the removable tactile input layer 260, based on a current usage input mode. Usage input modes may include a key press measurement input mode, a touch input mode, or a touchless gesture input mode. A host microprocessor executing machine readable code instructions of a regional capacitive pad gesture sensing orchestration system may operate to automatically switch among these usage modes. A touchless gesture input in an embodiment may include the user gesturing with a hand or finger above the surface of the removable tactile input layer 260 when the chassis 202 for the information handling system 200 is in an open position or above the surface the chassis lid when the chassis 202 is in a closed position. A touch input in an embodiment may comprise, for example, a user drawing with a finger across a plurality of keys of the keyboard 256 or across a portion of a bottom chassis 201 of the information handling system 200 situated to either side of a touchpad 253, or across a lid of a chassis 202 for the information handling system 200 when the chassis 202 is in a closed position.

Figure 2B:
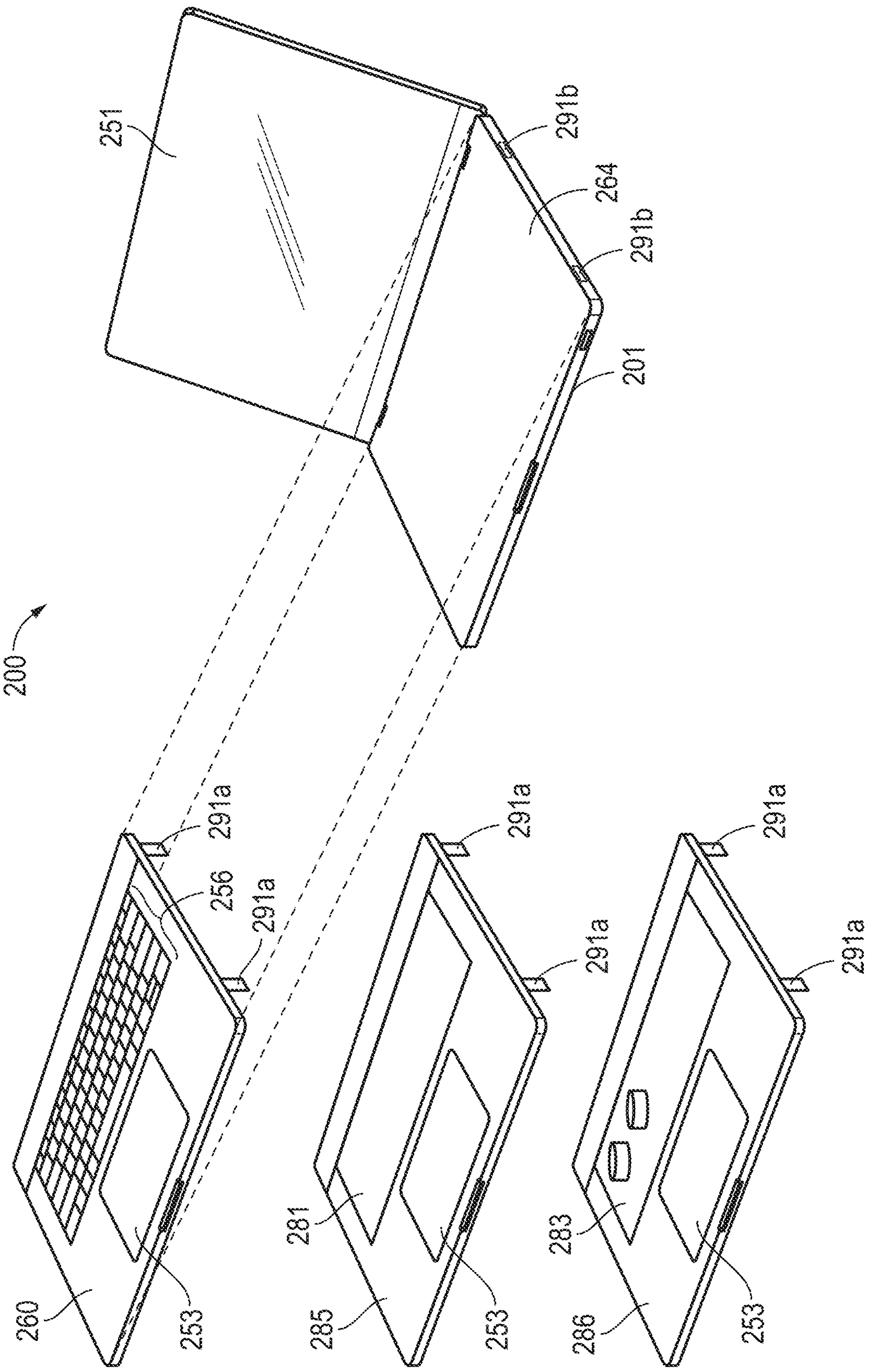
FIG. 2B is a graphic diagram illustrating an information handling system that includes an exploded depiction a keyboard removable tactile input layer, a control board removable tactile input layer, and a drawing pad removable tactile input layer that are interchangeably couplable to the sealed input surface having a keyboard sensing hardware structure formed thereunder according to an embodiment of the present disclosure.

FIG. 2B is a graphic diagram illustrating an information handling system 200 that includes a plurality of removable tactile input layers that may be installed and a separate keyboard sensing hardware structure formed under a sealed input surface to receive keyboard, touch and gesture input contactlessly at capacitive pad sensors from a user according to an embodiment of the present disclosure. As shown in FIG. 2B, the removable tactile input layers 260, 285 and 286 have been removed from the information handling system 200 to show the sealed input surface 264 of the base chassis 201 of the information handling system 200. The removable tactile input layers 260, 285 and 286 are shown as installable onto the sealed input surface 264 of the base chassis 201 of information handling system 200 according to various embodiments herein.

In an embodiment, the keyboard removable tactile input layer 260 including a keyboard structure 256 may be swapped with other input layers that may include a control board removable tactile input layer 286 or a drawing pad removable tactile input layer 285 among other types of removable tactile input layers. It is appreciated that the keyboard removable tactile input layer 260, the control board removable tactile input layer 286, and the drawing pad removable tactile input layer 285 may be only three examples of swappable removable tactile input layers that may be affixed to the top of the sealed input surface 264 using, for example, reciprocal removable tactile input layer coupling system structures 291*a* and 291*b*. Thus, each of the keyboard removable tactile input layer 260, the control board removable tactile input layer 286, and the drawing pad removable tactile input layer 285 may include a removable tactile input layer coupling system structure 291*a*, such as a latch, latch receiver, or interference fit structures, magnetic structures or the like. This removable tactile input layer coupling system structure 291*a* interfaces with reciprocal matching removable tactile input layer coupling system structure 291*b* formed on the base chassis 201 or in the sealed input surface 264 of the base chassis 201 of information handling system 200. Interfacing of reciprocal removable tactile input layer coupling system structures 291*a* and 291*b* may be formed along, for example, a periphery of the removable tactile input layers 260, 285, 286 and the sealed input surface 264 or along a bottom surface of the frame or tray support structure of the removable tactile input layers 260, 285, 286 and a top surface area of the sealed input surface 264 of the base chassis 201. Additional embodiments may include reciprocal removable tactile input layer coupling system structures 291-*b* formed on a side of base chassis 201 of information handling system 200. It is appreciated that any type of reciprocal removable tactile input layer coupling system structures 291*a* and 291*b* may be used to selectively secure any of the various removable tactile input layers 260, 285, and 286 to the sealed input surface 264. The reciprocal removable tactile input layer coupling system structures 291*a* and 291*b* may include any latch, fastener, interference fit edges, grooves or other interference fit structures, or other mechanical device that the user may access to remove the keyboard removable tactile input layer 260, the control board removable tactile input layer 286, and/or the drawing pad removable tactile input layer 285 from the sealed input surface 264 of the base chassis 201.

In an embodiment, the keyboard removable tactile input layer 260 may include a keyboard structure 256 with any number and layout of keyboard keys that include mechanical tactile feedback structures only. Plural keyboard removable tactile input layers 260 with a variety of keyboard layouts may be installed on the sealed input layer 264 with reciprocal removable tactile input layer coupling system structures 291*a* and 291*b* and operate with the separate keyboard sensing hardware structure formed under a sealed input surface 264 to receive keyboard, touch and gesture input contactlessly at capacitive pad sensors therein. The keyboard layout of each keyboard removable tactile input layer 260 include removable tactile input layer identification structures or devices that may be detected by detectors in the separate keyboard sensing hardware structure formed under a sealed input surface according to various embodiments described herein to identify the type of keyboard layout of keyboard structure 256 for the installed keyboard removable tactile input layer 260.

In an embodiment, the control board removable tactile input layer 286 may include a control surface 283 that allows a user to provide a different type of control and input to the information handling system 200. This may include any number of knobs, slides, and touch surfaces that allows the user to provide such input. Again, removable tactile input layer identification structures or devices that may be detected by detectors in the separate keyboard sensing hardware structure formed under a sealed input surface according to various embodiments described herein to identify the control board removable tactile input layer 286 is installed.

In an embodiment, the drawing pad removable tactile input layer 285 may include a drawing surface 281. The drawing surface 281 may allow a user to provide touch input at the drawing pad removable tactile input layer 285 to, for example, provide drawing strokes at the drawing surface 281. It is appreciated that because the sealed input surface 264 and lower stacks within the base portion of the information handling system 200 includes capacitive sensors, the user may provide both tactile input at the drawing surface 281 as well as gesture input above the surface of the drawing surface 281 to provide different types of input. Again, removable tactile input layer identification structures or devices that may be detected by detectors in the separate keyboard sensing hardware structure formed under a sealed input surface according to various embodiments described herein to identify the drawing pad removable tactile input layer 285 is installed.

In yet another embodiment, no removable tactile input layer may be installed on sealed input surface 264, but sealed input surface 264 may operate as a drawing surface without any removable tactile input layer. The sealed input surface 264 operating as a drawing surface in such an embodiment may allow a user to provide touch input to, for example, provide drawing strokes at the sealed input surface 264 operating as a drawing surface. It is appreciated that because the sealed input surface 264 and lower stacks within the base portion of the information handling system 200 includes capacitive sensors, the user may provide both tactile input at the sealed input surface 264 operating as a drawing surface as well as gesture input above the surface of the sealed input surface 264 operating as a drawing surface to provide different types of input. Again, removable tactile input layer identification structures or devices that may detect via the detectors in the separate keyboard sensing hardware structure formed under a sealed input surface according to various embodiments described herein to identify that no removable tactile input layer is installed in an embodiment.

Figure 3:
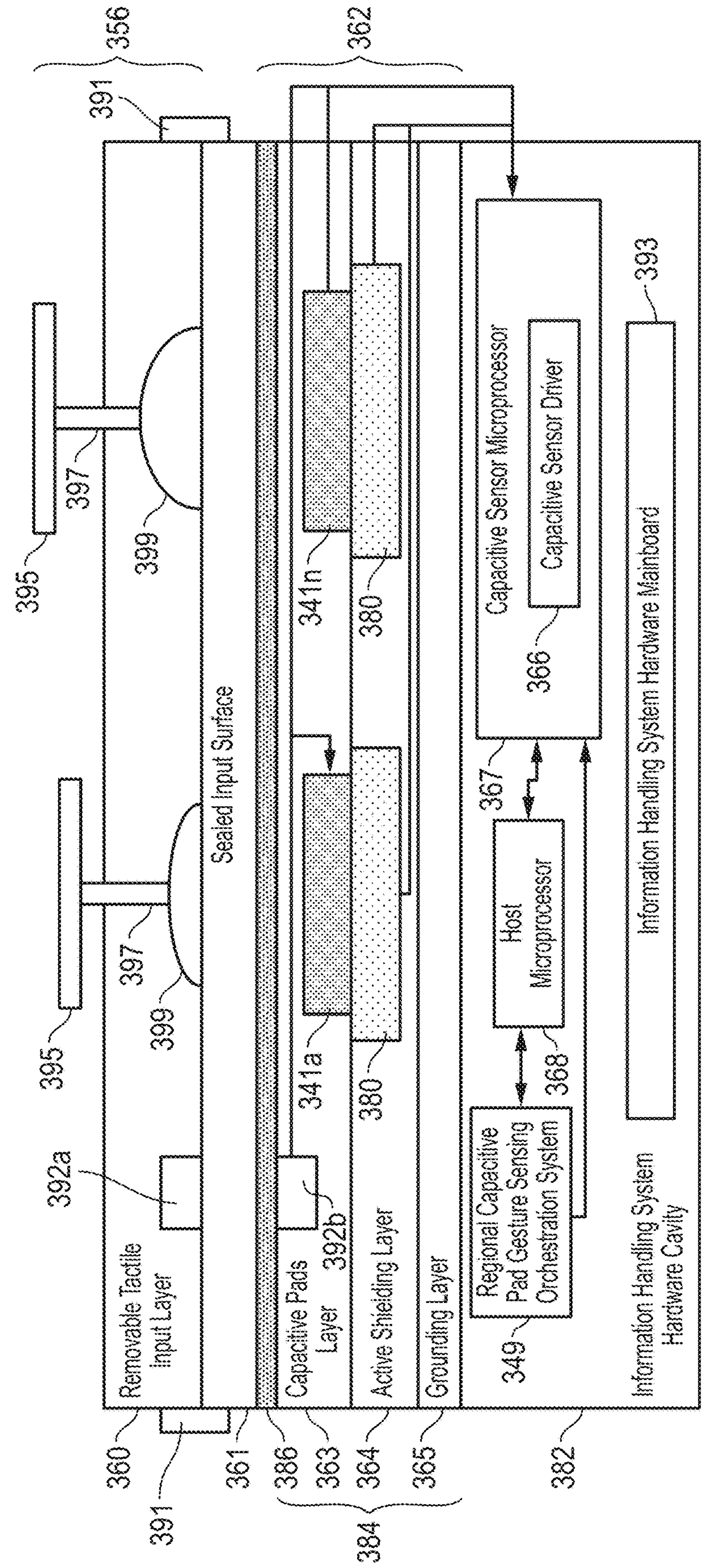
FIG. 3 is a graphic and block diagram illustrating a split keyboard structure stack that includes a removable tactile input layer and a separate sealed input surface to receive keyboard, touch and gesture input from a user contactlessly at capacitive pad sensors in a keyboard sensing hardware structure formed under the sealed input surface according to an embodiment of the present disclosure.

FIG. 3 is a graphic diagram illustrating a split-keyboard structure stack that includes a removable tactile input layer and a separate keyboard sensing hardware structure formed under a sealed input surface to receive user input on or above the removable tactile input layer contactlessly at capacitive pad sensors according to an embodiment of the present disclosure. As described herein, the split-keyboard structure stack up includes a keyboard structure 356 as part of a removable tactile input layer 360 and may further include a number of separate layers that form the keyboard sensing hardware structure 362 formed under a sealed input surface 361.

The keyboard sensing hardware structure 362 includes interface detection electronics, such as capacitive sensing pads 341*a* to 341*n*, and operates to contactlessly detect user input received on or above any removable tactile input layer 360 installed above the sealed input surface 361 and through which the user may provide input into the information handling system. The removable tactile input layer 360 may be that layer that a user interacts with via keypress of mechanical keyboard keys 395 of keyboard structure 356, touch input, or touchless gesture input above to provide input to the information handling system. This removable tactile input layer 360 may include only mechanical elements such as mechanical keyboard keys 395 of keyboard structure 356 formed into a grid, frame, or tray support structure of suitable material, such as plastic or ABS, to provide tactile response to the user when the mechanical keyboard keys 395 are pressed. In a specific example, the removable tactile input layer 360 may include a keycap or keyboard key 395 that includes a keyboard key post 397. The keyboard key 395 and keyboard key post 397 may be operatively and mechanically coupled to a keyboard key rubber dome 399 or popple. In this example embodiment, instead of the keyboard key rubber dome 399 having a switch or activating a switch on a PCB, the keyboard key rubber dome 399 may be used to help provide tactile feedback to the user such that the mechanical features imitate typical interactions with other types of keyboards. In some example embodiments, the removable tactile input layer 360 may also include scissor or butterfly arms (not shown) that also provide tactile feedback to the user while facilitating the recoil of the keyboard key 395 and keyboard key post 397 upwards for the keyboard structure 356. Thus, the removable tactile input layer 360 provides a simulated tactile feel to the user such that the user may feel when actuating the keys on any keyboard. However, the removable tactile input layer 360, which may include the keyboard structure 356, may be easily replaced without replacement of keyboard electronics should damage occur to any of the keyboard keys 395.

Thus, the removable tactile input layer 360 does not include any electrical elements that are used to receive electrical signals as the user presses the keyboard keys 395. Therefore, in the embodiments herein, the removable tactile input layer 360 does not include a PCB layer, a flexible PCB layer, contact switches or other electrical keypress detectors, or other electrical components that other keyboards may use to detect the press of a key by the user. Instead, in the embodiments herein, any number of removable tactile input layers 360, which may include a keyboard structure 356 without electrical keyboard components in some embodiments, will operate with the separate keyboard sensing hardware structure 362 formed under the sealed interface layer 361 that includes interface detection electronics, such as capacitive sensing pads, that can contactlessly detect user input.

In one embodiment shown in FIG. 3, the removable tactile input layer 360 may be installed on the sealed input surface 361 using reciprocal removable tactile input layer coupling system structures 391 on the sealed input layer 361 (or base chassis) and on the removable tactile input layer 360. In embodiments herein, the reciprocal removable tactile input layer coupling system structures 391 may include reciprocal latching mechanisms, reciprocal interference fit structures, reciprocal magnetic devices, or other coupling devices that allows user to couple and decouple the removable tactile input layer 360 to the sealed input layer 361 or the base chassis. This reciprocal removable tactile input layer coupling system structures 391 such as reciprocal latching mechanism structures, reciprocal interference fit structures, reciprocal magnetic devices, or other coupling structures allow a user to quickly decouple the removable tactile input layer 360 from the sealed input layer 361 in order to repair or replace the removable tactile input layer 360 as described herein. In an example embodiment, this reciprocal removable tactile input layer coupling system structures 391 may be a reciprocal latching mechanism that may include small, molded tabs integrated into the removable tactile input layer 360 that engage with matching recesses, slots, or holes formed in the sealed input surface 361 or on the base chassis. It is appreciated that other mechanical devices or mechanical structures may be used to selectively secure the removable tactile input layer 360 to the sealed input surface 361 including rotational latches, magnetic latching mechanisms, hook-and-slot latches, slide locking latches, interference fit grooves or extensions on the perimeter of a tray or grid of the removable tactile input layer 360 that interference fit with a frame or edge of the sealed input surface 361, and other latching or interference fit structures.

In an alternative example embodiment, the removable tactile input layer 360 may be installed onto and operatively coupled to the sealed input surface 361 using an adhesive layer (not shown). This adhesive layer may include any type of glue, tape, or other adhesive that may, at least temporarily, adhere a bottom surface of the removable tactile input layer 360 to a top surface of the sealed input surface 361 that includes the keyboard sensing hardware structure 362 formed under the sealed input surface 361.

As described herein, a separate half of the split-keyboard structure includes the keyboard sensing hardware structure 362 formed under the sealed input surface 361. The keyboard sensing hardware structure 362 formed under the sealed input surface 361 includes, as a top layer, the capacitive pads layer 363. The sealed input surface 361 prevents contaminants and liquids from entering into the remaining portions of the keyboard housing or base chassis of the information handling system. The sealed input surface 361 protects the electronics, such as carbon capacitive sensing pads and circuitry, of the keyboard sensing hardware structure 362 formed under the sealed input surface 361 as well as protecting hardware components, such as a motherboard, hardware processors, memory and other hardware components as described with reference to FIG. 1, that are disposed in the base chassis of the information handling system. This capacitive pads layer 363, an active shielding layer 364, and grounding layer 365 of the keyboard sensing hardware structure 362 formed under the sealed input surface 361 may be formed, for example, on a flexible PCB 384 circuit with a plurality of capacitive pad sensors 341*a* to 341*n* formed on or at the top surface of this flexible PCB 384 circuit. In an embodiment, the capacitive pad sensors 341*a* to 341*n* may include patches of deposited carbon on the flexible PCB circuit 384 configured to vary an electric field in response to changes in nearby capacitance. These carbon-based patches forming the capacitive pad sensors 341*a* to 341*n* of may be arranged in a sensor matrix and, during manufacturing, may be printed, sputtered, or otherwise deposited on the flexible PCB 384 circuit. In an embodiment, the array of deposited carbon patches may be arranged such that each key of the removable tactile input layer 360 aligns vertically above the sealed input surface 361 and a deposited capacitive pad sensor 341*a* to 341*n* (e.g., carbon patch) formed thereunder. In other embodiments, the carbon-based patches forming the capacitive pad sensors 341*a* to 341*n* of may be arranged in a sensor matrix and, during manufacturing, may be printed, sputtered, or otherwise deposited on the underside of the sealed input surface 361. The deposited capacitive pad sensors 341*a* to 341*n* in embodiment herein may be electrically coupled via conductive traces on the underside of the sealed input surface 361 or via the flexible PCB 384 circuit to one or more capacitive sensor microprocessors 367 and a power source (not shown).

As described herein, each of the capacitive pad sensors 341*a* to 341*n* of the capacitive pads layer 363 may be operatively coupled to one of a plurality of capacitive sensor microprocessors, including 367 executing machine readable code instructions of a capacitive sensor driver 366. In an embodiment, each of the capacitive pad sensors 341*a* to 341*n* that form the plurality of capacitive sensors within the capacitive pads layer 363 may be operatively coupled to one of the plurality of capacitive sensor microprocessors, including 367, via carbon traces formed on a surface such as a PCB or a flexible PCB circuit 384 in embodiments described herein. In embodiments herein, host microprocessor 368 or capacitive sensor microprocessor(s) 367 execute machine readable code instructions of the regional capacitive pad gesture sensing orchestration system 349 to automatically adjust or change subgroupings of capacitive pad sensors 341*a* to 341*n* that may be designated across an array of capacitive pad sensors 341*a* to 341*n*, such as for capacitive change sensing regions for detection at sub portions of user input across the removable tactile input layers 360. It is also appreciated that other types of traces may be formed to operatively couple the carbon pads of capacitive pad sensors 341*a* to 341*n*, such as silver or copper traces or indium tin oxide (ITO), that allow each of the carbon pads of the capacitive pad sensors 341*a* to 341*n* to conduct signals to the capacitive sensor microprocessor 367 for detection and determination of user input by the execution of the capacitive sensor driver 366. Detection of changes in capacitance at various levels of capacitance change are detected by the capacitive sensor microprocessor 367 and determined by the execution of the capacitive sensor driver 366 as indicative of a user's keypress inputs, a user's touch inputs, or a user's touchless gesture inputs at or near the keyboard keys 395 or other input surfaces of the keyboard structure 356 or the removable tactile input layer 360. The capacitive sensor driver 366 may be executed by the capacitive sensor microprocessor 367 to detect and determine which of the plurality of keyboard keys 395 on the removable tactile input layer 360 have been pressed and detected at corresponding capacitive pad sensors 341*a* to 341*n*. The capacitive sensor microprocessor 367 executing machine readable code instructions of the capacitive sensor driver 366 for processing of keystrokes or user gesture input may relay those inputs received at each of the capacitive pad sensors 341*a* to 341*n* from the capacitive sensor microprocessor 367 to the information handling system hardware mainboard 393 in the information handling system hardware cavity 382. Relay of those keypress inputs, touch inputs, or touchless gesture inputs detected at the capacitive sensor microprocessor 367 are provided as input to any hardware processor on the information handling system hardware mainboard 393 or host microprocessor 368 executing machine readable code instructions of the regional capacitive pad gesture sensing orchestration system 349 as input to the information handling system executing one or more software or firmware applications.

The capacitive pads layer 363 may be part of the flexible PCB 384 that also includes the active shielding layer 364 and the grounding layer 365. The active shielding layer 364 may include a plurality of shielding pads 380 that are formed vertically below each of the capacitive pad sensors 341*a* to 341*n* within the active shielding layer 364 and between the capacitive pad sensors 341*a* to 341*n* and a grounding layer 365. Each of the shielding pads 380 of the active shielding layer 364 may shield the plurality of capacitive sensors within the capacitive pads layer 363 from parasitic capacitive grounding by the nearby grounding layer 365 formed at the bottom of the flexible PCB 384. The grounding layer 365 and active shielding layer 364 may act as a controlled return path for noise and EMI for shielding of internal information handling system hardware components such as from information handling system hardware mainboard 393 from external EMI or containing EMI within the base chassis of the information handling system for compliance. The grounding layer 365 provides EMI and grounding for the electronics of the keyboard hardware sensing structure 362 as well as shielding the hardware components in the information handling system hardware cavity 382 of the base chassis such as those operating on the information handling system hardware mainboard 393 and described in further detail above with reference to FIG. 1.

In an embodiment, the shielding pads 380 of the active shielding layer 364 may be active shielding pads 380. These active shielding pads 380 may be driven using the same or similar voltage as the plurality of capacitive pad sensors 341*a* to 341*n* within the capacitive pads layer 363 and may also, each, be operatively coupled to the capacitive sensor driver 366 and a power source such as located in the information handling system hardware cavity 382. This reduces parasitic capacitance grounding between the plurality of capacitive pad sensors 341*a* to 341*n* of the capacitive pads layer 363 and the grounding layer 365 placed below the active shielding layer 364 such that the capacitive field of the capacitive pad sensors 341*a* to 341*n* is not as readily grounded reducing range and sensitivity. These active shielding pads 380 of the active shielding layer 364 improve signal-to-noise ratio and extend the sensing range of the plurality of capacitive sensors of the capacitive pads layer 363. Indeed, in an embodiment, the active shielding pads 380 allow a user to provide input such as gesture input which may have a low level of change in detected capacitance even when the user is not in physical contact with any of the keyboard keys of the removable tactile input layer 360 above the capacitive pad sensors 341*a* to 341*n* of the capacitive pads layer 363. This is because the capacitive sense capabilities of the capacitive pad sensors 341*a* to 341*n* is extended a distance above the surface of the removable tactile input layer 360 due to the inclusion of the shielding pads 380 of the active shielding layer 364.

As described, the grounding layer 365 may be formed directly below the active shielding layer 364 and forms a bottom-most layer of the flexible PCB 384 of the sealed input surface. The inclusion of the grounding layer 365 allows for a grounding source for the plurality of capacitive pad sensors 341*a* to 341*n* plus provides the EMI shielding and a safety ground for the split-keyboard stack up. In an embodiment, the grounding layer 365 may provide a stable electrical reference from the active circuitry that helps to define signal baseline at the plurality of capacitive pad sensors 341*a* to 341*n*.

It is appreciated that the flexible PCB 384 may form an upper portion of the base chassis of the information handling system just under the sealed input surface 361 that may form a top surface for the housing of the base chassis of the information handling system. However, the base chassis portion of the information handling system also includes the information handling system hardware cavity 382. The information handling system hardware cavity 382 may be present to provide space that other hardware component devices such as the hardware processor (e.g., FIG. 1, 102), memory devices, PMU, radiofrequency adapters, or wired ports to name a few of those hardware component devices that may be formed into the information handling system hardware cavity 382. As shown in FIG. 3, for example, the information handling system hardware cavity 382 may house an information handling system hardware mainboard 393 which may include a PCB that houses the hardware processor, other processing devices (e.g., FIG. 1, 102, 104, 106, 108, 110), the PMU, the wireless interface adapter, the radio, the RF front end, and the antenna among other hardware components. Thus, the grounding layer 365 may prevent any EMI and noise from affecting the operation of the capacitive pads layer 363 as described herein.

Figure 4:
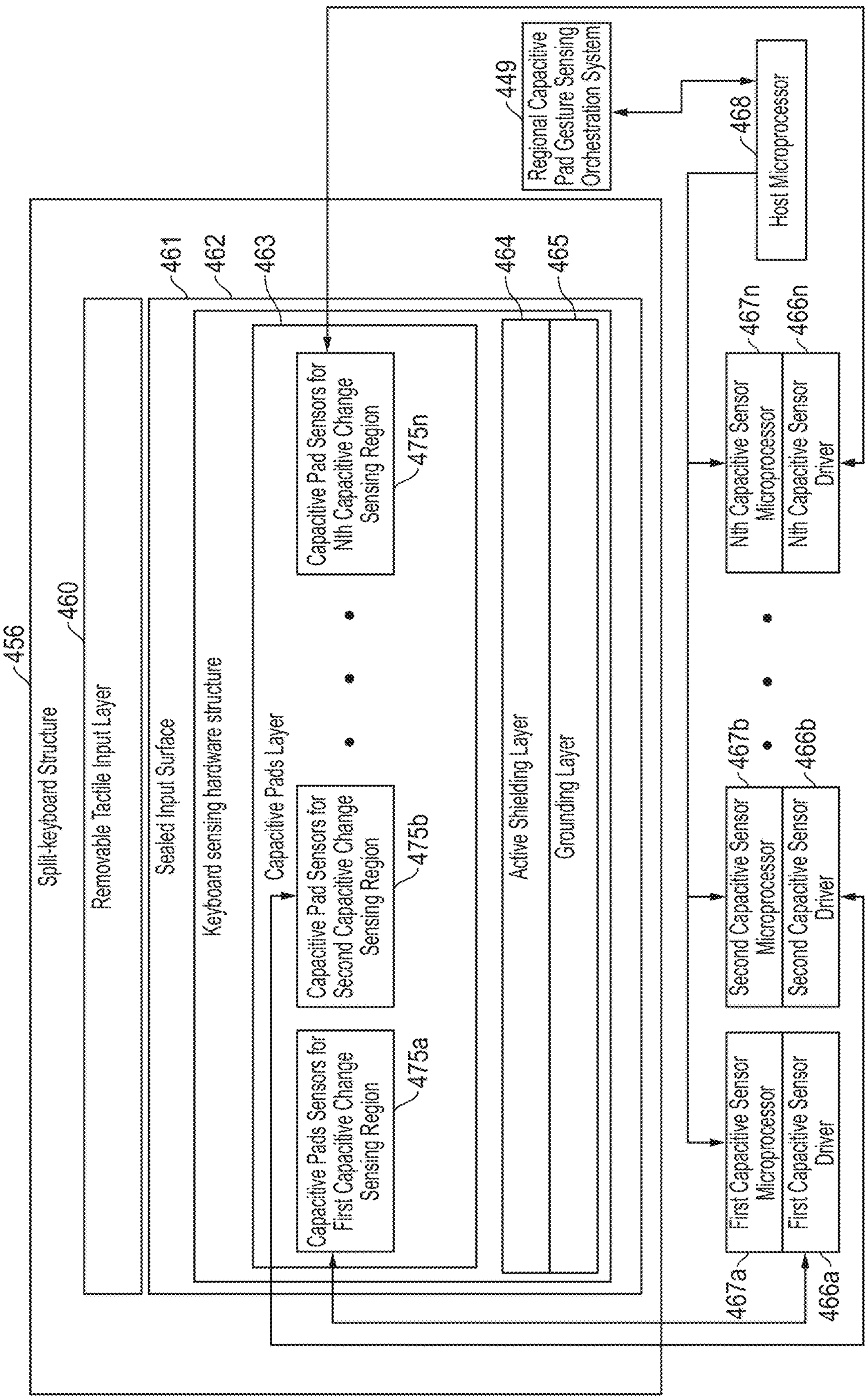
FIG. 4 is a block diagram illustrating a split-keyboard structure stack that includes capacitive pad sensors disposed in adjustable groups and operatively coupled to plural capacitive sensor microprocessors to receive user input in parallel and contactlessly from across a removable tactile input layer according to an embodiment of the present disclosure.

FIG. 4 is a graphical diagram illustrating a split-keyboard structure stack that includes capacitive pad sensors disposed in groups beneath for plural capacitive change sensing regions on a removable tactile input layer and operatively coupled to a plurality of capacitive sensor microprocessors to receive user input contactlessly according to an embodiment of the present disclosure. As described herein, a capacitive sensor microprocessors 467*a*, 467*b*, to 467*n* in an embodiment may each execute machine readable code instructions of a capacitive sensor driver 466*a*, 466*b*, to 466*n*, respectively, to sequentially scan capacitive pad sensors within capacitive pads layer 463 or to simultaneously read capacitance across a plurality of capacitive pad sensors within the capacitive pad sensor groups 475*a*, 475*b*, to 475*n*, assigned together into a capacitive change sensing regions, based on the current usage input mode. The plurality of capacitive sensor microprocessors 467*a*, 467*b*, to 467*n* in an embodiment may be each operatively coupled to and receiving user input from a plurality of capacitive pad sensors within plural capacitive pad sensor groups 475*a*, 475*b*, to 475*n* of the capacitive pads layer 463 of the split keyboard structure 456. This plurality of capacitive pad sensors in embodiments herein may be scanned sequentially or serially for capacitive changes within each of the capacitive pad sensor groups 475*a*, 475*b*, to 475*n* when it is desirable to distinguish between capacitive changes detected at individual capacitive pad sensors, such as when the information handling system is currently operating in a key press measurement input mode to detect distinct key presses at individual keys of the keyboard. This provides for a higher level of precision in detecting location of the user's finger at various points across the removable tactile input layer 460. In other embodiments herein, subgroups 475*a*, 475*b*, to 475*n* of the plurality of capacitive pad sensors may be scanned together simultaneously by each of the capacitive sensor microprocessors 467*a*, 467*b*, to 467*n* for capacitive changes when this level of granularity is not required.

For example, when the information handling system is currently operating in a touch input mode or a touchless gesture input mode, to decrease processing time for such detection the plural capacitive sensing microprocessors 467*a*, 467*b*, to 467*n* may detect entire capacitive pad sensor groups 475*a*, 475*b*, to 475*n* in parallel across multiple capacitive change sensing regions. Sensing capacitive changes from user input in parallel across plural capacitive change sensing regions may operate with a touch input mode or a touchless gesture input mode not requiring as high a level of precision as keypress inputs from a keyboard. User input received while in touch input mode may include, for example, a user drawing with a finger across a plurality of individual keys of the keyboard or across a portion of the bottom chassis of the information handling system situated to either side of a trackpad. User input received while in touchless gesture input mode may include, for example, a user gesturing with a hand or portion thereof above the surface of the removable tactile input layer 460 when the chassis is in an open position, or above the lid of the chassis of the information handling system is in a closed position.

When operating in either the touch input mode or the touchless gesture input mode, and in order to decrease latency in detecting such user input across these capacitive change sensing regions or areas, a host microprocessor 468 may execute machine readable code instructions of a regional capacitive pad gesture sensing orchestration system 449 to group subsets of the plurality of capacitive pad sensor groups 475*a*, 475*b*, to 475*n* together within plural capacitive change sensing regions, each comprising a portion of the full surface area of the removable tactile input layer 460. The host microprocessor 468 may then execute machine readable code instructions of the regional capacitive pad gesture sensing orchestration system 449 to orchestrate simultaneous detection of capacitive change across all capacitive pad sensors within each of these given subsets 475*a*, 475*b*, to 475*n*, to allow for simultaneous detection of capacitive change across these sectioned portions of the full surface area of the removable tactile input layer 460. This simultaneous sensing of capacitive change across the plurality of capacitive pad sensor groups 475*a*, 475*b*, to 475*n* may take less time than the sequential reading of each key individually across each and reduce latency of detected touch input or touchless gesture input spanning plural capacitive change sensing regions. In embodiments herein, the host microprocessor 468 may execute machine readable code instructions of the regional capacitive pad gesture sensing orchestration system 449 to instruct simultaneous sensing of capacitive change across a larger plurality of capacitive pad sensors in capacitive pad sensor groups 475*a*, 475*b*, to 475*n* within one or more larger capacitive change sensing regions while operating in user touchless gesture input mode, in order to increase a distance at which such capacitive changes may be sensed above the surface of the removable tactile input layer 460. In other embodiments herein, the host microprocessor 468 may execute machine readable code instructions of the regional capacitive pad gesture sensing orchestration system 449 to instruct simultaneous sensing of capacitive change across a smaller plurality of capacitive pad sensors in capacitive pad sensor groups 475*a*, 475*b*, to 475*n* for one or more smaller capacitive change sensing regions while operating in user touch input mode, in order to detect smaller movements of the finger with greater resolution than that which is required for touchless gesture input mode.

The host microprocessor 468 may orchestrate such adaptable capacitive sensor pad groupings 475*a*, 475*b*, to 475*n* of the plurality of capacitive pad sensors in embodiments herein by instructing the timing at which one or more capacitive sensor microprocessors 467*a*, 467*b*, to 467*n* operatively coupled to the plurality of capacitive pad sensors detects capacitive changes across those capacitive pad sensors in various sizes of capacitive pad sensor groups 475*a*, 475*b*, to 475*n*. When orchestrating simultaneous detection of capacitive change across a subset capacitive pad sensor groups 475*a*, 475*b*, or 475*n* of the plurality of capacitive pad sensors in a given capacitive change sensing region in an embodiment, the host microprocessor 468 may execute machine readable code instructions of the regional capacitive pad gesture sensing orchestration system 449 to instruct a single capacitive sensor microprocessor, such as 467*a* to simultaneously detect capacitive change across a plurality of operatively coupled capacitive pad sensors within subset group 475*a* of a capacitive change sensing region separately from other capacitive pad sensor groups 475*b* to 475*n*, if all capacitive pad sensors are operatively coupled to that single capacitive sensor microprocessor 467*a*. In other embodiments, a single capacitive change sensing region may comprise a subgroup, such as 475*a*, that includes some portion of the capacitive pad sensors operatively coupled to a first capacitive sensor microprocessor, such as 467*a*, and another portion of the capacitive pad sensors operatively coupled to a second capacitive sensor microprocessor, such as 467*b*. In such a case, the host microprocessor 468 may execute machine readable code instructions of the regional capacitive pad gesture sensing orchestration system 449 to instruct this plurality of capacitive sensor microprocessors 467*a* and 467*b*, each operatively coupled to one or more of portions of the capacitive pad sensors currently grouped together into subset 475*a* within that single capacitive change sensing region to simultaneously detect capacitive change, and may determine the capacitive change across that capacitive change sensing region as compared to other capacitive change sensing regions using multiple received inputs from the plurality of capacitive sensor microprocessors 467*a* and 467*b*.

The host microprocessor 468 executing machine readable code instructions of the regional capacitive pad gesture sensing orchestration system 449 in an embodiment may group the plurality of capacitive pad sensors into subgroups 475*a*, 475*b*, to 475*n* situated within distinct capacitive change sensing regions based on the current usage mode, or upon a user preference for greater speed and sensing distance or greater precision level for each of these modes. For example, each of the usage input modes may be associated with an initial or default assignment of each of the plurality of capacitive pad sensors into subgroups 475*a*, 475*b*, to 475*n* for each of the capacitive change sensing regions, with the touchless gesture input mode associated with the largest capacitive change sensing regions that include a greater number of capacitive pad sensors. This may be adjusted to the touch input mode associated with smaller capacitive change sensing regions including smaller numbers of capacitive pad sensors within more or a larger number of capacitive pad sensor groups 475*a*, 475*b*, and 475*c* having smaller capacitive change sensing regions across a removable tactile input layer and sealed input surface of the keyboard chassis. In other words, the touchless gesture input mode may be associated with fewer subgroups 475*a*, 475*b*, to 475*n* comprising larger capacitive change sensing regions, and the touch input mode may be associated with a greater number of subgroups, such as 475*a* to 475*n*, each comprising smaller capacitive change sensing regions.

A user may adjust the size of these capacitive change sensing regions and the frequency with which the capacitive changes are sensed within these capacitive change sensing regions may be adjusted in embodiments herein via a graphical user interface (GUI) of the regional capacitive pad gesture sensing orchestration system 449 to accommodate different levels of expected user input from hand or palm sensing mode, to touchless gesture input mode, to touch input mode, to keypress detection mode. In other embodiments, the host microprocessor 468 executing machine readable code instructions of the regional capacitive pad gesture sensing orchestration system 449 may automatically switch between the size of these capacitive change sensing regions and the frequency with which the capacitive changes are sensed for hand or palm sensing mode, touchless gesture input mode, touch input mode, or keypress detection mode based on capacitive detection levels of sensed user inputs or distances of those sensed user inputs.

For example, a user may wish to have an increase resolution of detected touch input when in touch input mode. In such a scenario, the host microprocessor 468 executing machine readable code instructions of the regional capacitive pad gesture sensing orchestration system 449 may decrease the number of capacitive pad sensors in a given subgroup 475*a*, 475*b*, to 475*n* and assigned to a given capacitive change sensing region to allow for increased resolution in detecting smaller movements of the user's finger across shorter distances of the removable tactile input layer 460. As another example, a user may wish to increase a distance above the surface of the removable tactile input layer 460 at which a touchless gesture input may be detected. In such a scenario, the host microprocessor 468 executing machine readable code instructions of the regional capacitive pad gesture sensing orchestration system 449 may increase the number of capacitive pad sensors in each subgroup 475*a*, 475*b*, to 475*n* and assigned to a given capacitive change sensing region, because the distance at which capacitive change may be sensed is proportional to the area or size of the capacitive change sensing region across which such a capacitive change may be sensed. As yet another example, a user may wish to decrease latency in detecting a user touch input or a touchless gesture input. In such a scenario, the host microprocessor 468 executing machine readable code instructions of the regional capacitive pad gesture sensing orchestration system 449 may increase the number of capacitive pad sensors in each subgroup 475*a*, 475*b*, to 475*n* and assigned to a given capacitive change sensing region, to decrease sensing time by simultaneously sensing capacitance across a larger plurality of capacitive pad sensors, rather than testing each sequentially. Finally, key by key detection may be required in a keypress detection mode and sensing of individual capacitive pad sensors may be appropriate by the capacitive sensor microprocessors 467*a*, 467*b*, to 467*n* for each subgroup 475*a*, 475*b*, to 475*n*. In such a way, the host microprocessor 468 operatively coupled to each of a plurality of capacitive sensor microprocessors 467*a* to 467*n* may execute machine readable code instructions of the regional capacitive pad gesture sensing orchestration system 449 to adjustably group capacitive sensing pads into capacitive change sensing regions of the removable tactile input layer 460 based upon current usage input mode or be customized via GUI receiving user instruction.

The keyboard sensing hardware structure 462 in an embodiment may be formed as part of a split keyboard structure 456 and disposed beneath a removable tactile input layer 460 and under a sealed input surface 461 of a keyboard chassis for an information handling system. The number and grouping of capacitive pads assigned to each of the capacitive sensor pad subgroups 475*a*, 475*b*, to 475*n* from capacitive pads layer 463 are adjustable and may correspond with capacitive change sensing regions for detection of user inputs on the removable tactile input layer 460 in various usage input modes.

A manufacturer in an embodiment may set a detected change in capacitance level for each of a plurality of capacitive sensor drivers 466*a*, 466*b*, to 466*n* for a key press input, a touch input, and a touchless gesture input. Each of these detected change in capacitance levels in an embodiment may define a change in capacitance detectable at a single capacitive pad sensor within one of subgroups 475*a*, 475*b*, to 475*n* that is associated with one of a key press mode for sensing user input via downward force on a key of the removable tactile input layer 460, a touch input mode for sensing user input via touch contact across the surface of the removable tactile input layer 460 or a touchless gesture mode for sensing user input via hand or finger gesture or movement a distance above the removable tactile input layer 460. For example, the key press measurement input mode may be triggered by detection of a change in capacitance meeting a threshold minimum capacitive change for the key press usage input mode, because physical contact and downward pressure on the keys may result in a higher change in capacitance than light touch or touchless gesturing above the keyboard. As another example, the touchless gesture input mode may be triggered by detection of a change in capacitance falling below a threshold capacitive change maximum for the touchless gesture input mode, because touchless gesture above the keyboard or above the lid of the chassis in some embodiments may result in a lowest possible change in capacitance in comparison to downward pressure on the keys or directing touching of the user's finger or hands to the removable tactile input layer 460. As yet another example, the touch input mode may be triggered by detection of a chance in capacitance that is below the threshold minimum for triggering the key press measurement input mode and above the threshold maximum for triggering the touchless gesture input mode.

Figure 5A:
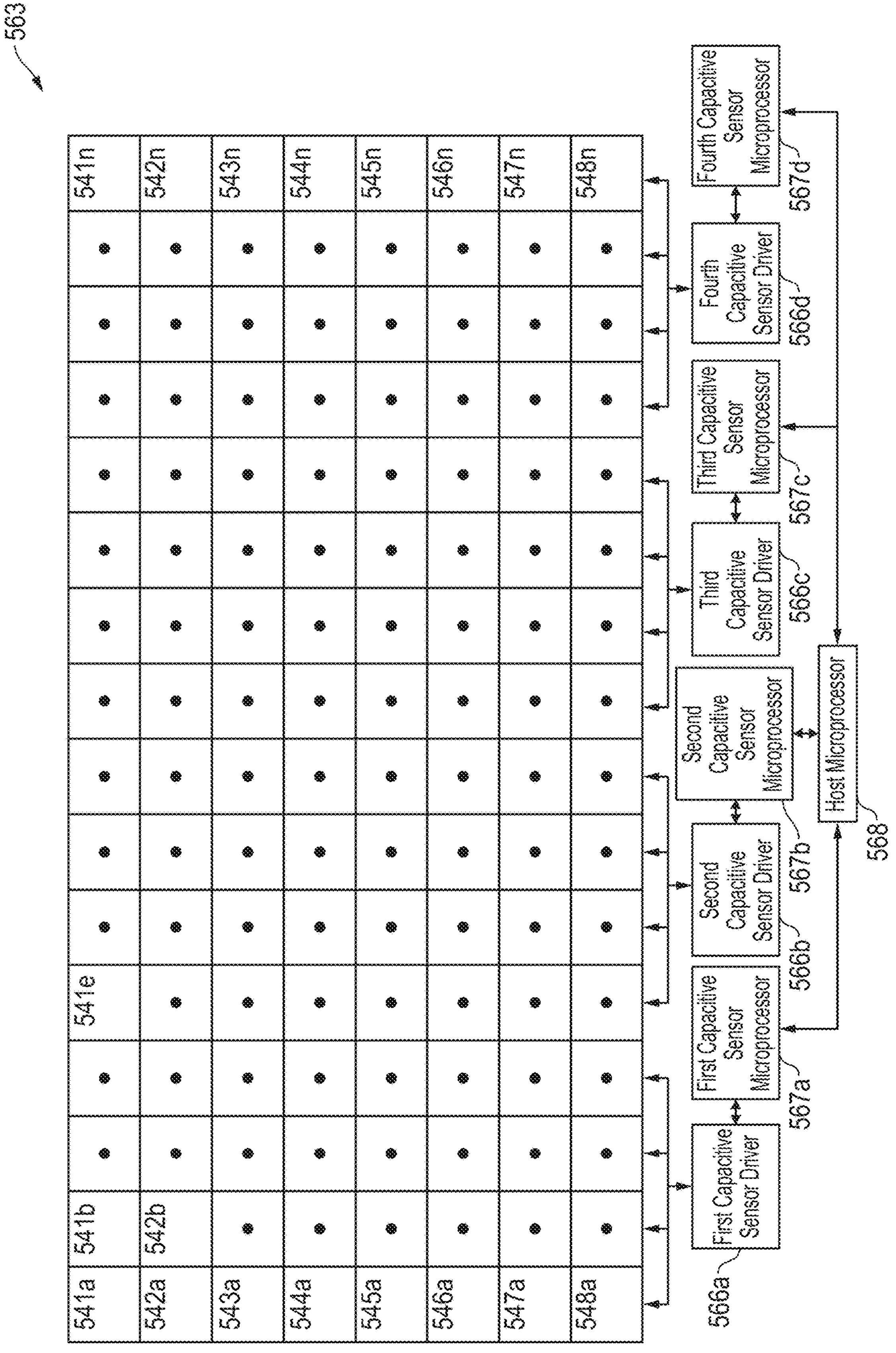
FIG. 5A is a graphical diagram illustrating a top view of a plurality of capacitive pad sensors of a keyboard sensing hardware structure, each disposed beneath a key of a removable tactile input layer for a keypress measurement input mode according to an embodiment of the present disclosure.

FIG. 5A is a graphical diagram illustrating a top view of a plurality of capacitive pad sensors, each disposed beneath a key of a removable tactile input layer with each capacitive pad sensor operatively coupled to one of a plurality of capacitive sensing microprocessors executing machine readable code instructions of capacitive sensor drivers according to an embodiment of the present disclosure. As described herein, capacitive sensor microprocessors 567*a*, 567*b*, 567*c*, or 567*d*, for example, may execute capacitive sensor driver 566*a*, 566*b*, 566*c*, or 566*d*, respectively. One or more capacitive sensor microprocessors 567*a*, 567*b*, 567*c*, or 567*d* may sequentially scan a plural arrays of capacitive pad sensors in a variety of arrangements. For example, capacitive pad sensors 541*a* to 548*a*, 541*b* to 548*b*, and across to 541*n* to 548*n* may be arranged in an array pattern as shown in FIG. 5A so as to be arranged under one or more keyboard keys of a removable tactile input layer having a keyboard and scanned by the one or more capacitive sensor microprocessors 567*a*, 567*b*, 567*c*, or 567*d*. Those capacitive sensor microprocessors 567*a*, 567*b*, 567*c*, or 567*d* operatively coupled to various of those capacitive pad sensors for serially reading those capacitive pad sensors 541*a* to 548*a*, 541*b* to 548*b*, across to 541*n* to 548*n* operatively coupled to each of the one or more capacitive sensor microprocessors 567*a*, 567*b*, 567*c*, or 567*d*. In embodiments, the one or more capacitive sensor microprocessors 567*a*, 567*b*, 567*c*, or 567*d* are used for simultaneous reading of capacitance changes across a plurality of capacitive pad sensors grouped together in various subgroupings to form a capacitive change sensing region across the capacitive pads layer 563 under a sealed input layer and removable tactile input layer installed above. This is described in greater detail below with respect to FIGS. 5B and 5C, and may adjust automatically via execution of machine readable code instructions of a regional capacitive pad gesture sensing orchestration system by a host microprocessor 568 according to embodiments herein based on the current usage input mode in an embodiment.

A host microprocessor 568 executing machine readable code instructions of a regional capacitive pad gesture sensing orchestration system in an embodiment may be operatively coupled to a plurality of capacitive sensor microprocessors 567*a*, 567*b*, 567*c*, or 567*d*, which may in turn be operatively coupled to and receiving user input from a plurality of capacitive pad sensors 541*a* to 548*a*, 541*b* to 548*b*, across to 541*n* to 548*n*, within the capacitive pads layer 563 of the split keyboard structure. This plurality of capacitive pad sensors 541*a* to 548*a*, 541*b* to 548*b*, across to 541*n* to 548*n* in an embodiment may be scanned sequentially or serially for capacitive changes when it is desirable to distinguish between capacitive changes detected at individual capacitive pad sensors, such as when the information handling system is currently operating in a key press measurement input mode to detect distinct key presses at individual keys of the keyboard. This provides for a higher level of precision in detecting location of the user's finger at various points across the removable tactile input layer.

Figure 5B:
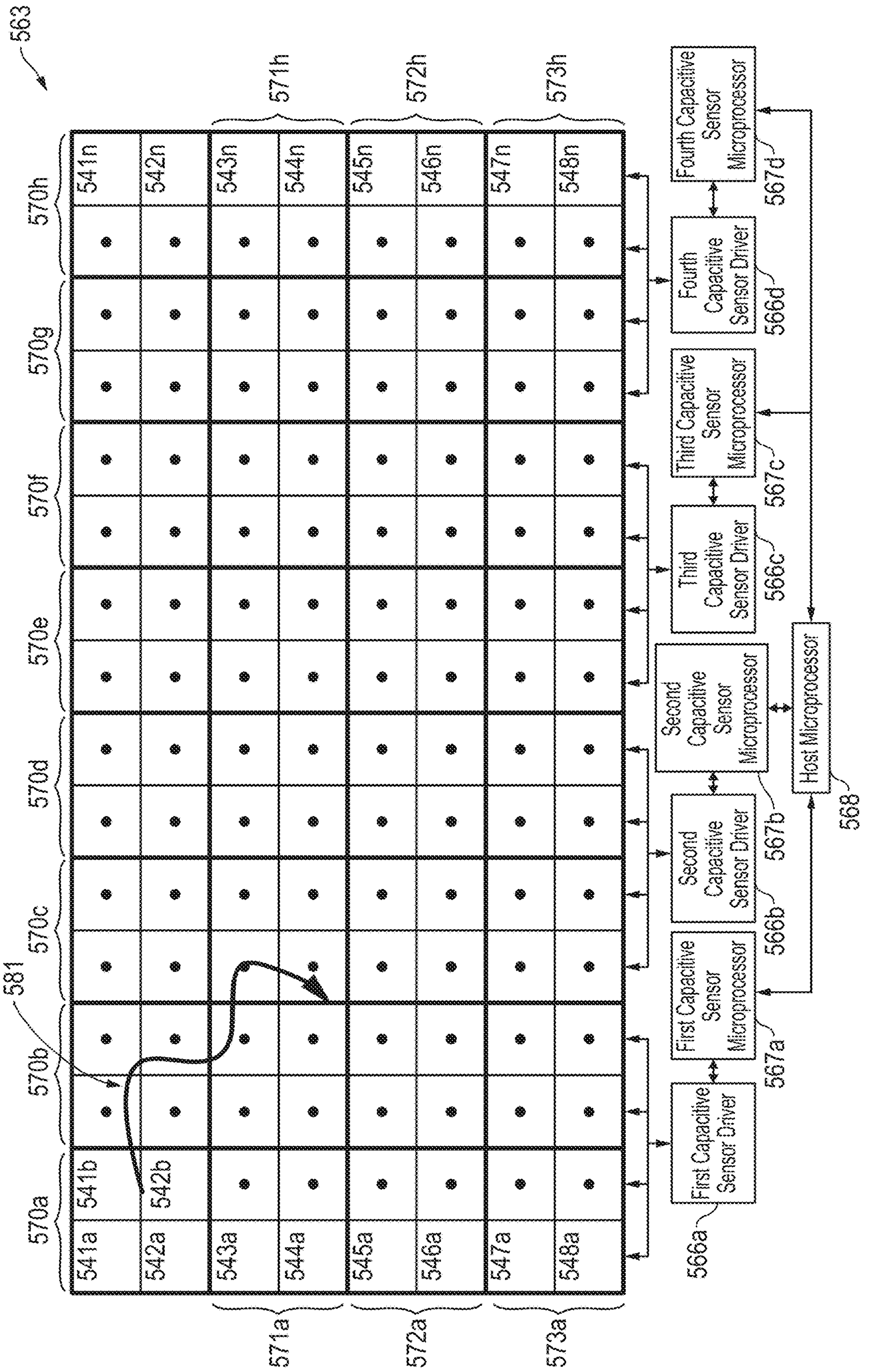
FIG. 5B is a graphical diagram illustrating a top view of a plurality of capacitive pad sensors of a keyboard sensing hardware structure in a plurality of capacitive change sensing regions disposed beneath a removable tactile input layer in grouping for operating in a user touch input mode according to an embodiment of the present disclosure.
Figure 5C:
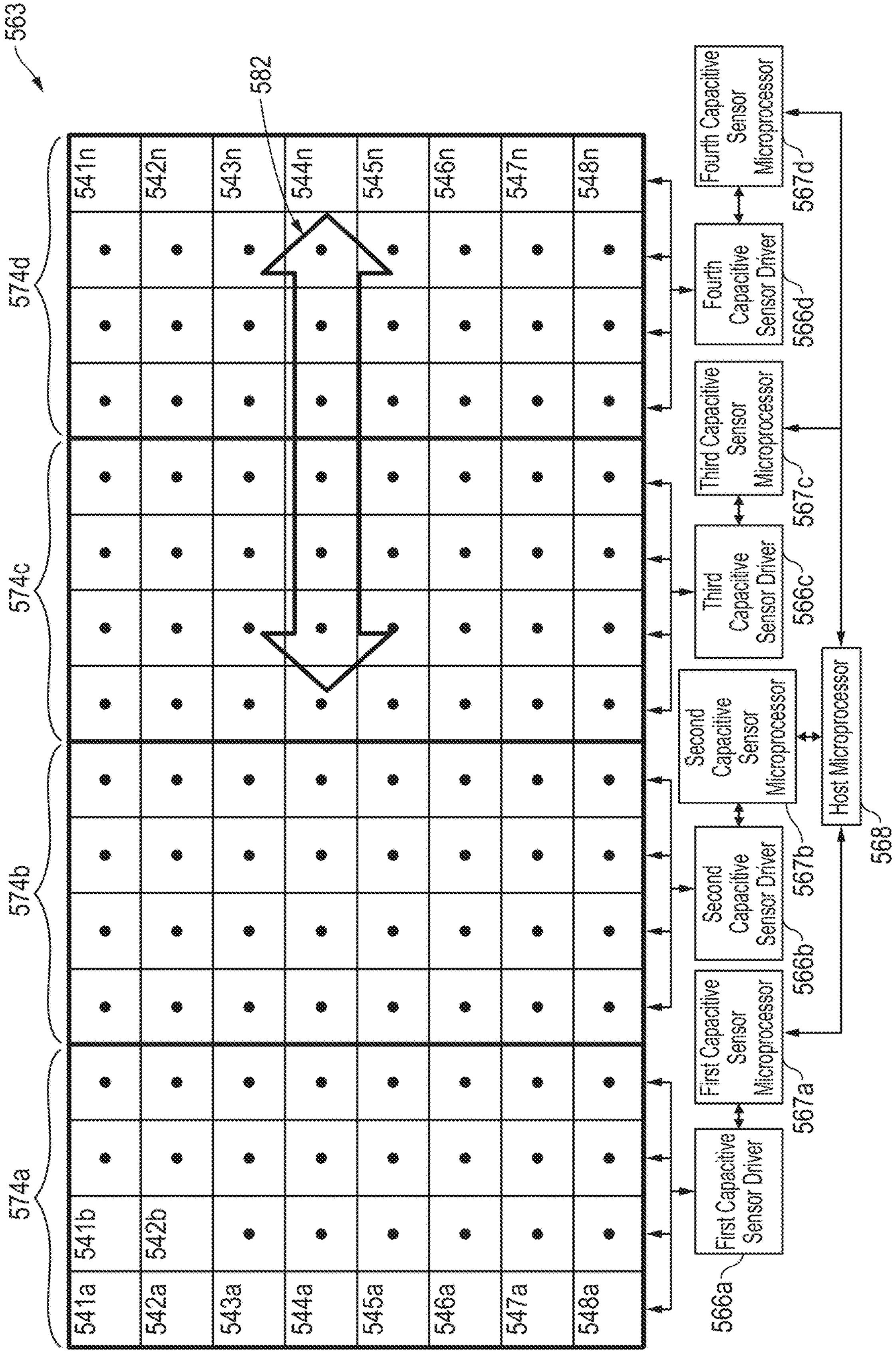
FIG. 5C is a graphical diagram illustrating a top view of a plurality of capacitive pad sensors of a keyboard sensing hardware structure a plurality of capacitive change sensing regions disposed beneath a removable tactile input layer in another grouping for operating in a touchless gesture input mode according to an embodiment of the present disclosure.

In other embodiments described with respect to FIGS. 5B and 5C, subgroups of the plurality of capacitive pad sensors such as 541*a* to 548*a*, 541*b* to 548*b*, or others across to 541*n* to 548*n*, may be scanned together simultaneously for capacitive changes when this level of granularity is not required, such as when the information handling system is currently operating in a touch input mode or a touchless gesture input mode, to decrease processing time for such detection. Thus, the host microprocessor 568 may orchestrate automatic adjustment to adaptable groupings of the plurality of capacitive pad sensors 541*a* to 548*a*, 541*b* to 548*b*, across to 541*n* to 548*n* in an embodiment by instructing the timing at which one or more capacitive sensor microprocessors 567*a*, 567*b*, 567*c*, or 567*d* operatively coupled to those plurality of capacitive pad sensors 541*a* to 548*a*, 541*b* to 548*b*, across to 541*n* to 548*n* are used to detect capacitive changes across the capacitive pads layer 563 from user input received above a sealed input surface of a keyboard chassis and a removable tactile input layer installed thereon. The host microprocessor 568 executes machine readable code instructions of the regional capacitive pad gesture sensing orchestration system for orchestrating simultaneous detection of capacitive change across a subset of the plurality of capacitive pad sensors 541*a* to 548*a*, 541*b* to 548*b*, or others across to 541*n* to 548*n* in a given capacitive change sensing region in an embodiment via instructing a single capacitive sensor microprocessor, such as 567*a* to simultaneously detect capacitive change across a plurality of operatively coupled capacitive pad sensors within a given designated subset when that subgroup of capacitive pad sensors within that capacitive change sensing region are operatively coupled to that single capacitive sensor microprocessor 567*a*. Multiple subgroups of capacitive pad sensors from that plurality operatively coupled to the single capacitive sensor microprocessor 567*a* may be variously designated into different sized subgroups for different sized capacitive change sensing regions depending on a usage mode detected by the regional capacitive pad gesture sensing orchestration system.

In other embodiments, a single capacitive change sensing region may comprise a subgroup of capacitive pad sensors that includes some capacitive pad sensors operatively coupled to a first capacitive sensor microprocessor 567*a* and some capacitive pad sensors operatively coupled to a second capacitive sensor microprocessor 567*b*. In such a case, the host microprocessor 568 may execute machine readable code instructions of the regional capacitive pad gesture sensing orchestration system to instruct this plurality of capacitive sensor microprocessors 567*a* and 567*b*, each operatively coupled to one or more of the capacitive pad sensors currently grouped together into the same subset within that single capacitive change sensing region to simultaneously detect capacitive change, and may determine the capacitive change across that capacitive change sensing region using multiple received inputs from the plurality of capacitive sensor microprocessors 567*a* and 567*b*.

FIG. 5B is a graphical diagram illustrating a top view of a plurality of capacitive change sensing regions in a first embodiment operating in a user touch input mode disposed beneath a removable tactile input layer wherein a plurality of capacitive pad sensors may be grouped within each of the capacitive change sensing regions via a host microprocessor based on user touch input mode needing lower latency and greater capacitive detection range than individual keypress measurement input mode as shown in FIG. 5A according to an embodiment of the present disclosure. As described herein, capacitive sensor microprocessors 567*a*, 567*b*, 567*c*, or 567*d*, for example, may execute capacitive sensor driver 566*a*, 566*b*, 566*c*, or 566*d*, respectively, to simultaneously read capacitance across a plurality of capacitive pad sensors grouped together into a capacitive change sensing region, based on the current usage input mode in an embodiment. For example, subgroups of the plurality of capacitive pad sensors 541*a* to 548*a*, 541*b* to 548*b*, or others across to 541*n* to 548*n*, may be grouped together by execution of the host microprocessor 568 executing machine readable code instructions of the regional capacitive pad gesture sensing orchestration system into subgroups of capacitive pad sensors forming capacitive change sensing regions 570*a* to 570*h*, 571*a* to 571*h*, 572*a* to 572*h*, 573*a* to 573*h* and so forth across the capacitive pads layer 563 when a user touch input mode for a user touch input 581 is detected. The regional capacitive pad gesture sensing orchestration system may instruct capacitive sensor microprocessors 567*a*, 567*b*, 567*c*, or 567*d* to simultaneously scan for capacitive changes from particular capacitive change sensing regions 570*a* to 570*h*, 571*a* to 571*h*, 572*a* to 572*h*, 573*a* to 573*h* and so forth across the capacitive pads layer 563 when the level of granularity for specific keypresses is not required, such as when the information handling system is currently operating in a touch input mode or a touchless gesture input mode. This simultaneous scanning across particular capacitive change sensing regions 570*a* to 570*h*, 571*a* to 571*h*, 572*a* to 572*h*, 573*a* to 573*h* serves to decrease processing time for capacitive detection of a user touch input 581 at those regions. More specifically, the plurality of capacitive pad sensors in an embodiment in which the current user mode is a touch input mode may be assigned to subgroups for capacitive change sensing regions 570*a* to 570*h*, 571*a* to 571*h*, 572*a* to 572*h*, and 573*a* to 573*h*. In one example embodiment, each of these subgroups for capacitive change sensing regions comprises four of the plurality of individual capacitive pad sensors. For example, subgroup for capacitive change sensing region 570*a* includes capacitive pad sensors 541*a*, 542*a*, 541*b* and 542*b* all operatively coupled to first capacitive sensor microprocessor 567*a* executing machine readable code instructions of capacitive sensor driver 566*a*. Other capacitive change sensing regions 570*a* to 570*h*, 571*a* to 571*h*, 572*a* to 572*h*, 573*a* to 573*h* may be operatively coupled to various plural capacitive sensor microprocessors 567*a*, 567*b*, 567*c*, or 567*d*, for example, as shown in FIG. 5B.

In an example embodiment, a user touch input 581 may include a user drawing with a finger across a plurality of keyboard keys of the keyboard in a removable tactile input layer. In another example embodiment, a user touch input 581 may include a user drawing with a finger across a portion the removable tactile input layer installed on the sealed input surface of the keyboard chassis of an information handling system situated to either side of a touchpad thereon. In yet another example embodiment, a user touch input 581 may include a user drawing with a finger across a lid of a display chassis for the information handling system when the display chassis is in a closed position. These are some examples of user touch input 581 that may be detected with less latency across a plurality of capacitive change sensing regions 570*a* to 570*h*, 571*a* to 571*h*, 572*a* to 572*h*, 573*a* to 573*h* assigned by a host processor 568 executing machine readable code instructions of the regional capacitive pad gesture sensing orchestration system.

The host microprocessor 568 may orchestrate such adaptable groupings of the plurality of capacitive pad sensors 541*a* to 548*a*, 541*b* to 548*b*, or others across to 541*n* to 548*n* in the capacitive pads layer 563 in an embodiment by instructing the timing at which one or more capacitive sensor microprocessors 567*a*, 567*b*, 567*c*, or 567*d* operatively coupled to the plurality of capacitive pad sensors 541*a* to 548*a*, 541*b* to 548*b*, or others across to 541*n* to 548*n* detects capacitive changes across those capacitive pad sensors 541*a* to 548*a*, 541*b* to 548*b*, or others across to 541*n* to 548*n* to detect a user touch input 581. For example, the host microprocessor 568 may instruct the capacitive sensor microprocessor 567*a* to simultaneously detect capacitance across each of the capacitive pad sensors 541*a*, 541*b*, 542*a*, and 542*b* in capacitive change sensing region 570*a* to decrease the amount of time required for such detection relative to further detection of a user touch input through to an adjacent capacitive change sensing region 570*b* or 571*a* to detect a gesture across those capacitive change sensing regions. This capacitive detection of those grouped capacitive pad sensors in the capacitive change sensing regions 570*a* to 570*h*, 571*a* to 571*h*, 572*a* to 572*h*, 573*a* to 573*h* is decreased in comparison to the sequential scanning of each of these capacitive pad sensors such as for keypress measurement input mode, as described in greater detail above with respect to FIG. 5A. Sequential scanning of capacitive pad sensors 541*a*, 541*b*, 542*a*, and 542*b* as well as others operatively coupled to first capacitive sensor microprocessor 567*a* would incur latency for a touch input in that capacitive change sensing region as compared to simultaneous scanning of capacitive pad sensors 541*a*, 541*b*, 542*a*, and 542*b* as capacitive change sensing region 570*a* by the first capacitive sensor microprocessor 567*a* in an example embodiment.

When orchestrating simultaneous detection of capacitive change across a subset of capacitive pad sensors for capacitive change sensing regions such as 570*a*, 570*b*, 570*c*, 570*d*, 570*e*, 570*f*, 570*g*, 570*h*, 571*a*, 571*b*, 571*c*, 571*d*, 571*e*, 571*f*, 571*g*, 571*h*, 572*a*, 572*b*, 572*c*, 572*d*, 572*e*, 572*f*, 572*g*, 572*h*, 573*a*, 573*b*, 573*c*, 573*d*, 573*e*, 573*f*, 573*g*, 573*h* in an embodiment, the host microprocessor 568 may execute machine readable code instructions of the regional capacitive pad gesture sensing orchestration system to instruct a single capacitive sensor microprocessor operatively coupled to the capacitive pad sensors in those capacitive change sensing regions to simultaneously detect capacitive change across the plurality of operatively coupled capacitive pad sensors in each of those capacitive change sensing regions for lower latency of touch gesture inputs that may span across multiple of those capacitive change sensing regions.

Plural capacitive sensor microprocessors including first capacitive sensor microprocessor 567*a*, second capacitive sensor microprocessor 567*b*, third capacitive sensor microprocessor 567*c*, and fourth capacitive sensor microprocessor 567*d* may be instructed to scan different subgroups of operatively coupled capacitive pad sensors from different capacitive change sensing regions such as 570*a*, 570*b*, 570*c*, 570*d*, 570*e*, 570*f*, 570*g*, 570*h*, 571*a*, 571*b*, 571*c*, 571*d*, 571*e*, 571*f*, 571*g*, 571*h*, 572*a*, 572*b*, 572*c*, 572*d*, 572*e*, 572*f*, 572*g*, 572*h*, 573*a*, 573*b*, 573*c*, 573*d*, 573*e*, 573*f*, 573*g*, 573*h* in a user touch input mode. In such a case, the host microprocessor 568 may execute machine readable code instructions to instruct this plurality of capacitive sensor microprocessors 567*a*, 567*b*, 567*c* and 567*d*, each operatively coupled to one or more of the capacitive pad sensors currently grouped together into the subsets within those capacitive change sensing regions such as 570*a*, 570*b*, 570*c*, 570*d*, 570*e*, 570*f*, 570*g*, 570*h*, 571*a*, 571*b*, 571*c*, 571*d*, 571*e*, 571*f*, 571*g*, 571*h*, 572*a*, 572*b*, 572*c*, 572*d*, 572*e*, 572*f*, 572*g*, 572*h*, 573*a*, 573*b*, 573*c*, 573*d*, 573*e*, 573*f*, 573*g*, 573*h*, to simultaneously detect capacitive change from those subset capacitive sensor pads in each capacitive change sensing region.

As described herein, the host microprocessor 568 executing machine readable code instructions of the regional capacitive pad gesture sensing orchestration system may automatically adjust the size of these capacitive change sensing regions and the frequency with which the capacitive changes are sensed within these capacitive change sensing regions in an embodiment. As an example, a user may wish to decrease latency in detecting user touch input or touchless gesture input. In such a scenario, the host microprocessor 568 may execute machine readable code instructions of the regional capacitive pad gesture sensing orchestration system to increase the number of capacitive pad sensors in each subgroup such as 570*a* to include more than four capacitive pad sensors, to decrease sensing time by simultaneously sensing capacitance across a larger plurality of capacitive pad sensors, such as six or ten, for example. As another example, a user may wish to increase precision or resolution of detected user touch input. In such a scenario, the host microprocessor 568 may execute machine readable code instructions of the regional capacitive pad gesture sensing orchestration system to decrease the number of capacitive pad sensors in each subgroup, such as 570*a*, to include fewer than four capacitive pad sensors (e.g., 541*a* and 542*a* in one subgroup and 541*b* and 542*b* in a separate subgroup), to allow for sensing of capacitive changes across shorter distances (e.g., smaller capacitive change sensing regions) of the removable tactile input layer, such as between capacitive pad sensors 541*a* and 541*b*, for example. The host microprocessor in an embodiment may then execute machine readable code instructions of the regional capacitive pad gesture sensing orchestration system to instruct one or more of the plurality of capacitive sensor microprocessors 567*a*, 567*b*, 567*c*, or 567*d* to simultaneously sense capacitive change in operatively coupled capacitive pad sensors within one or more capacitive change sensing regions 570*a* to 570*h*, 571*a* to 571*h*, 572*a* to 572*h*, or 573*a* to 573*h* for a touch input 581, each including a plurality of capacitive pad sensors, such as 541*a* to 548*a*, 541*b* to 548*b*, or others across to 541*n* to 548*n*, grouped together according to touch input mode.

FIG. 5C is a graphical diagram illustrating a top view of a plurality of capacitive change sensing regions in a second embodiment operating in a touchless gesture input mode disposed beneath a removable tactile input layer, wherein a plurality of capacitive pad sensors may be grouped within each of the capacitive change sensing regions via a host microprocessor based on user preference for greater speed or greater sensing distance above the surface of the removable tactile input layer according to an embodiment of the present disclosure. As described herein, a host microprocessor executes machine readable code instructions of the regional capacitive pad gesture sensing orchestration system to direct one or more capacitive sensor microprocessors 567*a*, 567*b*, 567*c*, or 567*d* executing one or more capacitive sensor drivers 566*a*, 566*b*, 566*c*, or 566*d*, respectively, to simultaneously read capacitance across a plurality of capacitive pad sensors 541*a* to 548*a*, 541*b* to 548*b*, or others across to 541*n* to 548*n* that are grouped together into capacitive change sensing regions 574*a* to 574*d* to detect a user touchless gesture input 582, based on the current usage input mode in an embodiment. For example, subgroups of the plurality of capacitive pad sensors 541*a* to 548*a*, 541*b* to 548*b*, or others across to 541*n* to 548*n* formed as capacitive change sensing regions 574*a* to 574*d* may be scanned together simultaneously for capacitive changes when a level of granularity for a keypress or even a touch input gesture is not required, such as when the information handling system is currently operating in a touchless gesture input mode. This may decrease processing time for such capacitive detection of a touchless gesture input 582 as well as capacitive field detection range increase by using more capacitive pad sensors within each capacitive change sensing region 574*a*, 574*b*, 574*c* and 574*d*. More specifically, in one example embodiment in which the current user mode is a touchless gesture input mode, the host microprocessor 568 executing machine readable code instructions may assign 32 of the plurality of individual capacitive pad sensors, such as 541*a* to 548*a*, 541*b* to 548*b*, or others across to 541*n* to 548*n*, into subgroups for each capacitive change sensing region 574*a*, 574*b*, 574*c*, and 574*d* to detect touchless gesture input 582 (e.g., between capacitive change sensing regions 574*a* and 574*b*).

In an example embodiment, a user touchless gesture input 582 may include a user gesturing with a finger or hand above a plurality of keyboard keys of the keyboard in a removable tactile input layer with an information handling system display chassis in an open position. In another example embodiment, a user touchless gesture input 582 may include a user gesturing with a finger or hand above a portion the removable tactile input layer installed on the sealed input surface of the keyboard chassis of an information handling system situated that is other than where a keyboard portion is located. In yet another example embodiment, a user touchless gesture input 582 may include a user gesturing with a finger or hand above a lid of a display chassis for the information handling system when the display chassis is in a closed position. These are some examples of user touchless gesture input 582 that may be detected with less latency across a plurality of capacitive change sensing regions 574*a*, 574*b*, 574*c*, and 574*d* assigned by a host processor 568 executing machine readable code instructions of the regional capacitive pad gesture sensing orchestration system.

As described herein, the host microprocessor 568 executing machine readable code instructions of the regional capacitive pad gesture sensing orchestration system may automatically adjust the size of these capacitive change sensing regions and the frequency with which the capacitive changes are sensed within these capacitive change sensing regions in an embodiment. In other aspects, the host microprocessor 568 may execute machine readable code instructions of the regional capacitive pad gesture sensing orchestration system to receive user input to make these adjustments. As an example, an increase in a distance above the surface of the removable tactile input layer at which a touchless gesture input may be detected may be adjusted for during a usage mode involving detecting touchless gesture inputs above a removable tactile input layer. In such a scenario, the host microprocessor 568 executing machine readable code instructions of the regional capacitive pad gesture sensing orchestration system may increase the number of capacitive pad sensors assigned to a given capacitive change sensing region (e.g., from 32 to 64), because the distance at which capacitive change may be sensed is proportional to the number of capacitive sensor pads in an area or size of the capacitive change sensing region across which such a capacitive change may be sensed. Thus, increasing the size of the given capacitive change sensing region to include 64 of the capacitive pad sensors, rather than 32 may increase the distance above the surface of the removable tactile input layer at which touchless gesture input may be detected. The host microprocessor in an embodiment may then execute machine readable code instructions of the regional capacitive pad gesture sensing orchestration system to instruct one or more of the plurality of capacitive sensor microprocessors 567*a*, 567*b*, 567*c*, or 567*d* to simultaneously sense capacitive change in operatively coupled capacitive pad sensors within one or more capacitive change sensing regions 574*a*, 574*b*, 574*c*, and 574*d*, each including a plurality of capacitive pad sensors, such as 541*a* to 548*a*, 541*b* to 548*b*, or others across to 541*n* to 548*n*, grouped together according to touchless gesture input mode.

Figure 6:
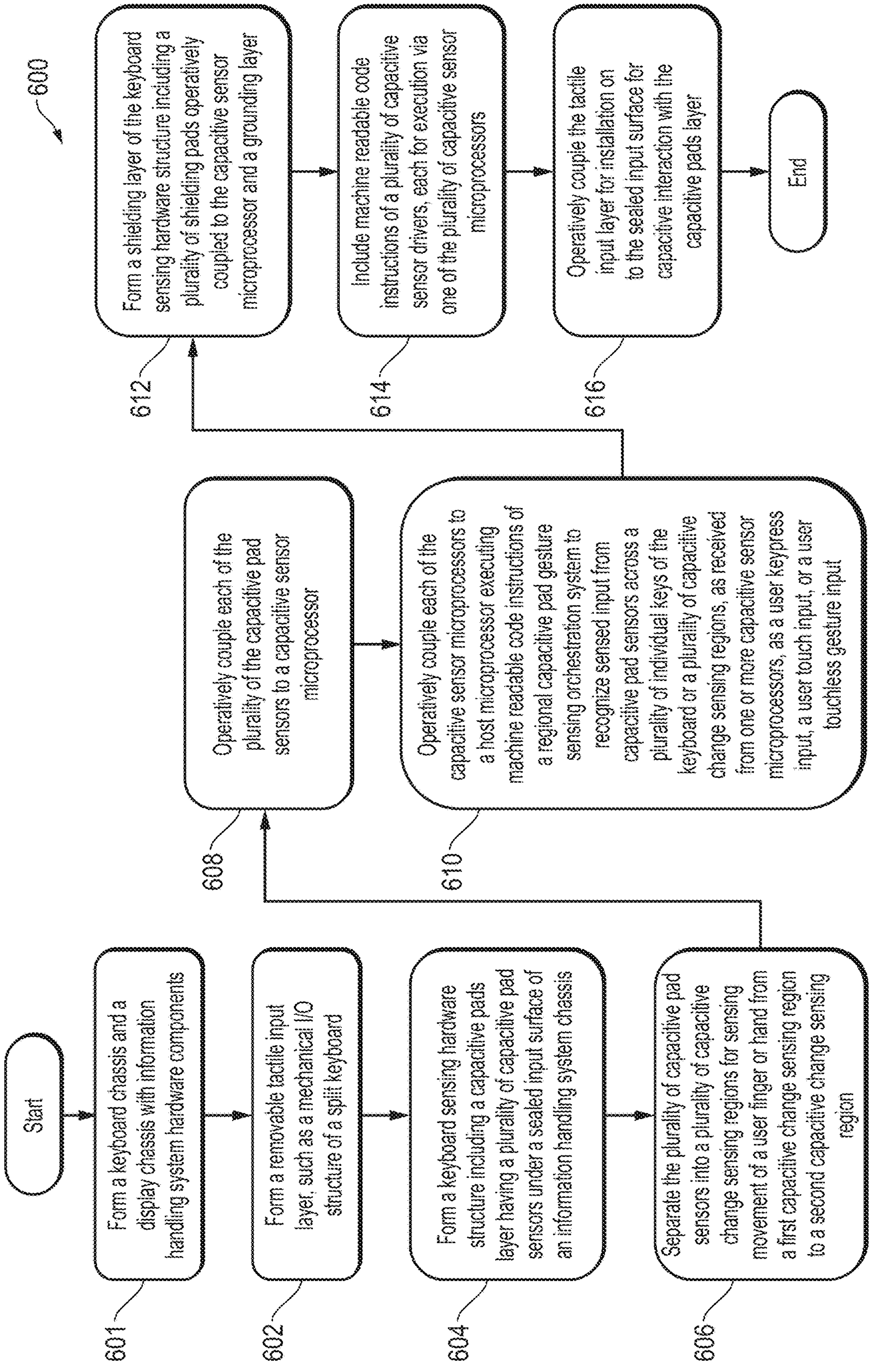
FIG. 6 is a flow diagram showing a method of manufacturing a split keyboard structure for an information handling system that includes a removable tactile input layer and a separate keyboard sensing hardware structure formed under a sealed input surface of a keyboard chassis to receive keyboard, touch and gesture input contactlessly at capacitive pad sensors from a user according to an embodiment of the present disclosure.

FIG. 6 is a flow diagram showing a method 600 of manufacturing a split keyboard structure for an information handling system that includes a removable tactile input layer and a separate keyboard sensing hardware structure including a plurality of capacitive pad sensors in a capacitive pads layer with a grounding layer and an active shielding layer formed under a sealed input surface to receive keyboard input, touch input or gesture input contactlessly at capacitive pad sensors according to an embodiment of the present disclosure. The method may include similar manufacturing processes to form any of those split keyboard stack structures of hardware layers as described in connection with embodiments above that each include a bifurcated or split keyboard stack. The method of assembly for the split keyboard stack of structure layers comprises the keyboard sensing hardware structure formed under a sealed input surface of a keyboard chassis or base chassis of the information handling system with a capacitive pads layer, an active shielding layer, and a grounding layer in various embodiments.

At block 601, the method 600 may include forming a base chassis or housing of the information handling system such as a tray or other structure and installing a motherboard with hardware processors, memory devices, a PMU, and other hardware components of the information handling system described herein. As described herein, the information handling system may be a laptop-type information handling system that includes a base chassis portion operatively coupled to a display chassis portion via a hinge. In embodiments herein, information handling system hardware components, such as those described in connection with FIG. 1 and including an information handling system hardware mainboard or other processor boards that may include various hardware processors, memory, power systems, network interface or wireless interface devices, among others, may be installed within the base chassis of the information handling system. In an embodiment, the other information handling system hardware devices may also include fans, port systems, and a battery that may be sized to fit within this base chassis portion with the motherboard. In some embodiments, this step of including information handling system hardware components in the base chassis may occur after formation of the keyboard sensing hardware structure layers under the sealed input surface of the keyboard chassis.

At block 602, the method 600 includes forming a removable tactile input layer of a keyboard. The removable tactile input layer may be that layer that a user interacts with to provide input to the information handling system such as keyboard keypress input, touch input on keyboard keys or on a touch surface, or gesture input detected above the removable tactile input layer in various embodiments herein. This removable tactile input layer may include only mechanical elements such as mechanical keys that provide tactile response to the user when the mechanical keys are pressed. In a specific example, the removable tactile input layer may include a keyboard key and keyboard key post that is operatively coupled to a rubber dome or popple. In this example embodiment, instead of the rubber dome having a switch or activating a switch on a PCB, the rubber dome may be used to help provide tactile feedback to the user. However, actuation of such mechanical keyboard keys of the removable tactile input layer may be contactlessly sensed by capacitive pad sensors, that may be subgrouped, of the keyboard sensing hardware structure formed under a sealed input surface of a chassis of the information handling system as described below. In an example embodiment, the removable tactile input layer may also include scissor or butterfly arms that also provide tactile feedback to the user while facilitating the recoil of the keycap upwards. However, the removable tactile input layer does not include any electrical elements that are used to receive electrical signals as the user presses the keyboard keys. Therefore, in the embodiments herein, the removable tactile input layer does not include a PCB layer, a flexible PCB layer, or other electrical components that other keyboards may use to detect the press of a keyboard key by the user. In embodiments herein, the removable tactile input layer is formed of mechanical keyboard keys in a set and arrangement with mechanical components such as keycaps, popples, scissor structures, and/or may include one or more touch surfaces or touchable keyboard keys.

The removable tactile input layer may be formed as a unit structure layer of mechanical components having a plurality of keyboard keys and/or one or more touch input areas or structures in embodiments herein. The removable tactile input layer may be a removable tactile input layer keyboard structure for example with a preselected arrangement of keyboard keys and a removable tactile input layer support structure made of plastic or other appropriate material for supporting the key popples, any scissor structures, keycaps, touchpads or touch areas, or the like without electrical components in various embodiments herein. In one embodiment, the removable tactile input layer includes a removable tactile input layer support structure, such as a tray or frame made of plastic or other suitable material, that includes edges or sides with an edge, lip, groove, slot, or interface structure along a side or bottom surface of the removable tactile input layer support structure to provide for an interference fit with a reciprocal structure to operably couple the removable tactile input layer to the sealed input surface of the chassis, such as a base chassis, of the information handling system. In another embodiment, the removable tactile input layer includes a removable tactile input layer support structure, such as a tray or frame made of plastic or other suitable material, that includes a latch or a latch receiver along one or more sides of the removable tactile input layer support structure edge, edges, or bottom surface to provide for latching structure interface with a reciprocal structure to operably couple the removable tactile input layer to the sealed input surface of the chassis, such as a base chassis, of the information handling system. In yet another embodiment, the removable tactile input layer includes a removable tactile input layer support structure, such as a tray or frame made of plastic or other suitable material, that includes a magnet or magnetic structure along a side or bottom surface of the removable tactile input layer support structure to provide for an magnetic interaction with a reciprocal magnet or magnetic structure to operably couple the removable tactile input layer to the sealed input surface of the chassis, such as a base chassis, of the information handling system. In this way, any of a plurality of removable tactile input layers formed according to embodiments herein may receive keyboard keypress inputs, touch inputs, or gesture inputs above the sealed input surface of the chassis of the information handling system operating as a mechanical removable tactile input layer that is contactlessly detected by a keyboard sensing hardware structure formed under a sealed input surface of the information handling system chassis described in more detail below.

At block 604, the method 600 further includes forming a keyboard sensing hardware structure including a capacitive pads layer that includes a plurality of capacitive pad sensors. The keyboard sensing hardware structure is formed under, as part of or adhered to, the sealed input surface of the chassis of an information handling system in various embodiments. The capacitive pads layer may include a plurality of capacitive sensors that can sense changes in capacitance from user interaction on or above the removable tactile input layer proximate and above the sealed input surface of the chassis. These capacitive pad sensors are arranged at locations under the sealed input surface of the chassis to detect varying levels of capacitive changes caused by a user's fingers at locations across the sealed input surface for touch or gesture inputs. Further, these capacitive pad sensors are arranged to correspond under one or more keyboard keys of a removable tactile input layer keyboard structure to detect a capacitive change associated with a keypress actuation of one or more keyboard keys.

In an embodiment, the plurality of capacitive pad sensors may include patches of deposited carbon configured to vary an electric field in response to changes in nearby capacitance above the sealed input surface of the chasses at the location of the capacitive pad sensor. These carbon-based patches may be arranged in a sensor matrix and may be printed, sputtered, or otherwise deposited on a non-conductive substrate such as an ABS polymer surface, a flexible PCB, or other PCB. In another embodiment, the ABS polymer surface may be the underside of the sealed input surface of the base chassis of the information handling system in an embodiment. In an embodiment, the array of deposited carbon patches may be arranged such that each key of the removable tactile input layer aligns vertically with one or more deposited carbon patch. In embodiments herein, the deposited carbon patches may be arranged into subgroups of capacitive change sensing regions or capacitive pad subgroup capacitive change sensing regions with plural capacitive pad subgroup capacitive change sensing regions to be electrically coupled to respective capacitive sensor microprocessors for detection of user inputs in parallel among the capacitive pad subgroup capacitive change sensing regions as described in embodiments below.

At block 606, the plurality of capacitive pad sensors in an embodiment may be separated into a plurality of capacitive change sensing regions for sensing movement of a user finger or hand from a first capacitive change sensing region to a second capacitive change sensing region. For example, in embodiments described with respect to FIGS. 5B and 5C, capacitive sensor microprocessors 567*a*, 567*b*, 567*c*, or 567*d*, for example, may execute capacitive sensor driver 566*a*, 566*b*, 566*c*, or 566*d*, respectively, to simultaneously read capacitance across a plurality of capacitive pad sensors grouped together into a capacitive change sensing region, based on the current usage input mode in an embodiment. Subgroups of the plurality of capacitive pad sensors such as 541*a* to 548*a*, 541*b* to 548*b*, or others across to 541*n* to 548*n*, may be scanned together simultaneously for capacitive changes when a level of granularity for a keypress detection is not required, such as when the information handling system is currently operating in a touch input mode or a touchless gesture input mode. Detecting subgroupings of capacitive sensor pads in capacitive change detection regions helps to decrease processing time for capacitive detection of a touch gesture input or a touchless gesture input that may span plural capacitive change detection regions as compared to sequential scanning in individual capacitive pad sensors across a capacitive pads layer. More specifically, as described with reference to FIG. 5B, the plurality of capacitive pad sensors such as 541*a* to 548*a*, 541*b* to 548*b*, or others across to 541*n* to 548*n* in an embodiment in which the current user mode is a touch input mode may be assigned to subgroups of capacitive sensor pads in capacitive change detection regions 570*a* to 570*h*, 571*a* to 571*h*, 572*a* to 572*h*, and 573*a* to 573*h*, with each of these subgroups comprising four of the plurality of individual capacitive pad sensors. In another example embodiment described with respect to FIG. 5C, the plurality of capacitive pad sensors such as 541*a* to 548*a*, 541*b* to 548*b*, or others across to 541*n* to 548*n* in an embodiment in which the current user mode is a touchless gesture input mode may be assigned to subgroups 574*a*, 574*b*, 574*c*, and 574*d*, with each of these subgroups comprising 32 of the plurality of individual capacitive pad sensors such as 541*a* to 548*a*, 541*b* to 548*b*, or others across to 541*n* to 548*n*.

The host microprocessor 568 may execute machine readable code instructions to orchestrate such adaptable groupings of the plurality of capacitive pad sensors such as 541*a* to 548*a*, 541*b* to 548*b*, or others across to 541*n* to 548*n* in an embodiment by instructing the timing at which one or more capacitive sensor microprocessors 567*a*, 567*b*, 567*c*, or 567*d* operatively coupled to the plurality of capacitive pad sensors, such as 541*a* to 548*a*, 541*b* to 548*b*, or others across to 541*n* to 548*n*, detects capacitive changes across those capacitive pad sensors to form various adjustable-sized subgroupings. For example, the host microprocessor 568 may instruct the capacitive sensor microprocessor 567*a* to simultaneously detect capacitance across each of the capacitive pad sensors 541*a*, 541*b*, 542*a*, and 542*b* to decrease the amount of time required for such detection in comparison to the sequential scanning of each of these capacitive pad sensors 541*a*, 541*b*, 542*a*, and 542*b* to detect a touch gesture input 581 across plural capacitive change detection regions 570*a* to 570*h*, 571*a* to 571*h*, 572*a* to 572*h*, and 573*a* to 573*h*.

Each of the plurality of the capacitive pad sensors within one or more of the plurality of capacitive change sensing regions in an embodiment at block 608 may be operatively coupled to one of a plurality of capacitive sensor microcontrollers. For example, in embodiments described with respect to FIGS. 5A, 5B, and 5C, when orchestrating simultaneous detection of capacitive change across a subset of capacitive sensor pads 541*a* to 548*a*, 541*b* to 548*b*, or others across to 541*n* to 548*n* for capacitive change detection regions 570*a* to 570*h*, 571*a* to 571*h*, 572*a* to 572*h*, and 573*a* to 573*h* in an embodiment, the host microprocessor 568 may execute machine readable code instructions to instruct a single capacitive sensor microprocessor, such as 567*a* to simultaneously detect capacitive change across a plurality of operatively coupled capacitive pad sensors 541*a*, 541*b*, 542*a*, and 542*b*, for example within a given subset 570*a*. For example, the host microprocessor 568 executing machine readable code instructions of the regional capacitive pad gesture sensing orchestration system may instruct the capacitive pad sensors 541*a*, 541*b*, 542*a*, and 542*b* to simultaneously report capacitive change readings within that capacitive change sensing region 570*a* when all are operatively coupled to that single capacitive sensor microprocessor 567*a*. Any number of capacitive pad sensors may be sub-grouped by the regional capacitive pad gesture sensing orchestration system into any number of capacitive change detection regions 570*a* to 570*h*, 571*a* to 571*h*, 572*a* to 572*h*, and 573*a* to 573*h*.

In various other embodiments, any single capacitive change sensing region may comprise a subgroup that includes some capacitive pad sensors operatively coupled to a first capacitive sensor microprocessor 567*a* and some capacitive pad sensors operatively coupled to a second capacitive sensor microprocessor 567*b*. In such a case, the host microprocessor 568 may execute machine readable code instructions to instruct this plurality of capacitive sensor microprocessors 567*a* and 567*b*, each operatively coupled to one or more of the capacitive pad sensors currently grouped together into subset within that single capacitive change sensing region to simultaneously detect capacitive change, and may determine the capacitive change across that capacitive change sensing region using multiple received inputs from the plurality of capacitive sensor microprocessors 567*a* and 567*b*.

The capacitive pad sensors may be operatively coupled to one of a plurality of capacitive sensor microcontrollers via copper, silver, or carbon traces formed on an under surface of the ABS polymer sealed input surface or on a surface such as a PCB or a flexible PCB, or some combination in embodiments described herein. The capacitive sensor microcontrollers may be formed on a PCB or a flexible PCB in embodiments herein. The capacitive sensor microcontrollers execute machine readable code instructions of capacitive sensor drivers and may be operatively coupled to a hardware processor of the information handling system for provision of user I/O inputs such as keypress inputs, touch inputs, or touchless gesture inputs to the hardware processor executing machine readable code instructions of one or more software or firmware applications. It is also appreciated that other types of traces may be formed to operatively couple the carbon pads to the capacitive sensor drivers such as copper traces, silver traces, or indium tin oxide (ITO) within a flexible PCB or under a sealed input surface of the base chassis that allow each of the carbon pads to conduct change in capacitance signals to the capacitive sensor microcontrollers for the capacitive sensor drivers. The capacitive sensor drivers may determine detected capacitive changes are indicative of a user's keypress input, user's touch, or a touchless gesture at or near the keys or other input surfaces of the removable tactile input layer portion of the split keyboard structure above the sealed input surface of the chassis of the information handling system.

At block 610 in an embodiment, each of the capacitive sensor microcontrollers may be operatively coupled to a host microprocessor executing machine readable code instructions of a regional capacitive pad gesture sensing orchestration system to recognize sensed input from capacitive pad sensors across a plurality of individual keys of the keyboard or a plurality of capacitive change sensing regions, as received from one or more capacitive sensor microprocessors, as a user keypress input, a user touch input, or a user touchless gesture input. For example, in an embodiment described with respect to FIG. 5A, capacitive sensor microprocessors 567*a*, 567*b*, 567*c*, or 567*d*, may execute capacitive sensor driver 566*a*, 566*b*, 566*c*, or 566*d*, respectively, to sequentially scan a plural array of capacitive pad sensors such as 541*a* to 548*a*, 541*b* to 548*b*, or others across to 541*n* to 548*n*, as shown in FIG. 5A, or to simultaneously read capacitance across a plurality of capacitive pad sensors grouped together into a capacitive change sensing region, as described in greater detail with respect to FIGS. 5B and 5C, based on the current usage input mode in an embodiment. A host microprocessor 568 executing machine readable code instructions of a regional capacitive pad gesture sensing orchestration system in an embodiment may be operatively coupled to a plurality of capacitive sensor microprocessors 567*a*, 567*b*, 567*c*, or 567*d*, which may in turn be operatively coupled to and receiving user input from a plurality of capacitive pad sensors such as 541*a* to 548*a*, 541*b* to 548*b*, or others across to 541*n* to 548*n*, within the capacitive pads layer 563 of the split keyboard structure. This plurality of capacitive pad sensors such as 541*a* to 548*a*, 541*b* to 548*b*, or others across to 541*n* to 548*n* in an embodiment may be scanned sequentially or serially for capacitive changes. For example, this scanning may be sequential when it is desirable to distinguish between capacitive changes detected at individual capacitive pad sensors such as when the information handling system is currently operating in a key press measurement input mode to detect distinct key presses at individual keys of the keyboard. This provides for a higher level of precision in detecting location of the user's finger at various points across the removable tactile input layer. In other embodiments, capacitive change detection regions having various numbers of capacitive pad sensors such as 541*a* to 548*a*, 541*b* to 548*b*, or others across to 541*n* to 548*n* may be scanned simultaneously to provide for lower latency when scanning for touch gesture or touchless gesture inputs from a user.

The method 600 further includes forming an active shielding layer that includes a plurality of shielding pads at block 612 as part of the keyboard sensing hardware structure that is formed under, as part of or adhered to, the sealed input surface of the chassis of an information handling system. The active shielding layer may include a plurality of shielding pads that are formed vertically below each of the capacitive pad sensors within the active shielding layer, such as on a PCB or on a flexible PCB. Each of the shielding pads of the active shielding layer may act to shield the plurality of capacitive sensors within the capacitive pads layer from a ground layer formed below on the keyboard sensing hardware structure for EMI protection from components in the information handling system. The grounding layer may act as a controlled return path for noise and external EMI that would otherwise disrupt the operation of the plurality of capacitive pad sensors of the capacitive pads layer. However, close location of the grounding layer needed for a thin keyboard sensing hardware structure may also impact operation or ground out the capacitive sensing pads. Thus, active shielding pads of the active shielding layer are formed between the grounding layer and the capacitive pad sensors in the keyboard sensing hardware structure formed under the sealed input surface of the chassis of an information handling system in embodiments herein.

In an embodiment, the shielding pads of the active shielding layer are active shielding pads operatively coupled to the capacitive sensor microprocessor. These active shielding pads may be driven by the capacitive sensor microprocessor using the same voltage as the plurality of capacitive pad sensors within the capacitive pads layer thereby shielding or avoiding grounding of the capacitive sensing pads by the nearby ground layer for EMI protection of the keyboard or other I/O structures. The active shielding pads are also, each, operatively coupled to the capacitive sensor microprocessor and a power source, such as a PMU, in the keyboard sensing hardware structure formed under the sealed input surface of the chassis of an information handling system when installed. In this way, the active shielding pads reduce parasitic capacitance between the corresponding plurality of capacitive pad sensors of the capacitive pads layer and the grounding layer placed below the active shielding layer. These active shielding pads of the active shielding layer improve signal-to-noise ratio and extends the sensing range of the plurality of capacitive pad sensors of the capacitive pads layer such as for detecting lower capacitive change levels, for example, that may be associated with a removable tactile input layer positioned further from the corresponding capacitive pad sensors or for touch inputs on or touchless gesture inputs above the removable tactile input layer of the split keyboard structures in embodiments herein. Indeed, in an embodiment, the active shielding pads allows a user to provide input such as gesture input even when the user is not in physical contact with any of the keys of a removable tactile input layer detected as a capacitive change from the capacitive pad sensors of the capacitive pads layer. This is because the capacitive sense capabilities of the capacitive pad sensors is extended a distance above the surface of the removable tactile input layer due to the inclusion of the shielding pads of the active shielding layer which are not subject to parasitic grounding of the grounding layer.

At block 614, the method 600 includes providing for firmware machine readable code instructions of a capacitive sensor driver to each of the plurality of capacitive sensor microcontrollers for receiving capacitive difference level changes from the operatively coupled network of the plurality of capacitive pad sensors to determine the input as a keypress input of a keyboard key, as a touch input on the keyboard keys or other I/O structure, or as a touchless gesture input above a removable tactile input layer. The machine readable code instructions of the capacitive sensor drivers execute on the capacitive sensor microprocessors to process various types of user input via the removable tactile input layer, as characterized by one or more detected capacitive change levels and characterized by location or movement across locations in the network of capacitive pad sensors, as I/O input from the user for the hardware processor of the information handling system. As described herein, the capacitive sensor drivers may be executed by the capacitive sensor microprocessors to detect and determine which of the plurality of keys on the removable tactile input layer, associated with particular capacitive pad sensors below the sealed input surface of the chassis, have been pressed and detected at each of the plurality of capacitive sensors. If the detected capacitive change is at a first capacitive change level, the capacitive sensor driver may relay these keypress inputs for particular keyboard keys from the capacitive sensor microprocessors to the hardware processor for processing of keystrokes as input to software or firmware applications executing on the information handling system. Similarly, a second level of capacitive change detected at one or more capacitive pad sensors may indicate a touch input on keys or other I/O structures of the removable tactile input layer above the sealed input surface of the chassis such that the capacitive sensor microprocessors executing the capacitive sensor drivers may determine a touch or touch gesture of the user in some embodiments. In an example embodiment, the second level of capacitive change may be lower or less than the first level of capacitive change associated with a keypress. In yet another embodiments, a third level of capacitive change may be detected at one or more capacitive pad sensors that may indicate a touchless gesture input above any I/O structures of a removable tactile input layer. This third level of capacitive change detected may be lower than the second level of capacitive change detected by the capacitive pad sensors and the capacitive sensor microprocessors in embodiments herein.

In an embodiment at block 616, the split-keyboard structure of embodiments herein may be completed by operatively coupling the removable tactile input layer on to sealed input surface, which may be removed and replaced by another removable tactile input layer for use with the keyboard sensing hardware structure as formed under the sealed input surface of the base chassis of an information handling system. This removable tactile input layer may be installed over the sealed input surface via an interference fit system, magnetic interface structures, mechanical latch or other structure such that the removable tactile input layer is detachable and replaceable with a new or different removable tactile input layer for use with the keyboard sensing hardware structure formed under the sealed input surface of the chassis. The removable tactile input layer is replaceable as a mechanical-only portion of the split-keyboard structure.

In an embodiment, the removable tactile input layer includes a removable tactile input layer support structure, such as a tray or frame made of plastic or other suitable material, that includes edges or sides with an edge, lip, groove, slot, or interface structure along a side or bottom surface of the removable tactile input layer support structure to provide for an interference fit with a reciprocal structure to operably couple the removable tactile input layer to the sealed input surface of the chassis, such as a base chassis, of the information handling system as described. The removable tactile input layer is installed by an interference fit into a reciprocal structure of the sealed input surface of the chassis of the information handling system. In another embodiment, the removable tactile input layer includes a removable tactile input layer support structure, such as a tray or frame made of plastic or other suitable material, that includes a latch or a latch receiver along one or more sides of the removable tactile input layer support structure edge, edges, or bottom surface to provide for latching structure interface with a reciprocal structure to operably couple the removable tactile input layer to the sealed input surface of the chassis, such as a base chassis, of the information handling system. The removable tactile input layer is installed via the latch or other fastener device into a reciprocal latch structure or fastener of the sealed input surface of the chassis of the information handling system. In yet another embodiment, the removable tactile input layer includes a removable tactile input layer support structure, such as a tray or frame made of plastic or other suitable material, that includes a magnet or magnetic structure along a side or bottom surface of the removable tactile input layer support structure to provide for a magnetic interaction with a reciprocal magnet or magnetic structure to operably couple the removable tactile input layer to the sealed input surface of the chassis, such as a base chassis, of the information handling system. The removable tactile input layer is installed via magnetic attachment between it and a reciprocal magnet or magnetic structure of the sealed input surface of the chassis of the information handling system. In yet another embodiment, the removable tactile input layer may be operatively coupled to the sealed input surface using an adhesive layer. This adhesive layer may include any type of glue, tape, or other adhesive that may, at least temporarily, adhere a bottom surface of the removable tactile input layer to a top surface of the sealed input surface of the chassis of the information handling system.

In this way, any of a plurality of removable tactile input layers formed according to embodiments herein may receive keyboard keypress inputs, touch inputs, or gesture inputs at a mechanical removable tactile input layer above the sealed input surface of the chassis of the information handling system operating that is contactlessly detected by a keyboard sensing hardware structure formed under a sealed input surface of the information handling system chassis of embodiments herein. At this point the method 600 may end with the split-keyboard structure of embodiments herein being formed in, for example, a base portion of a laptop-type information handling system.

Figure 7:
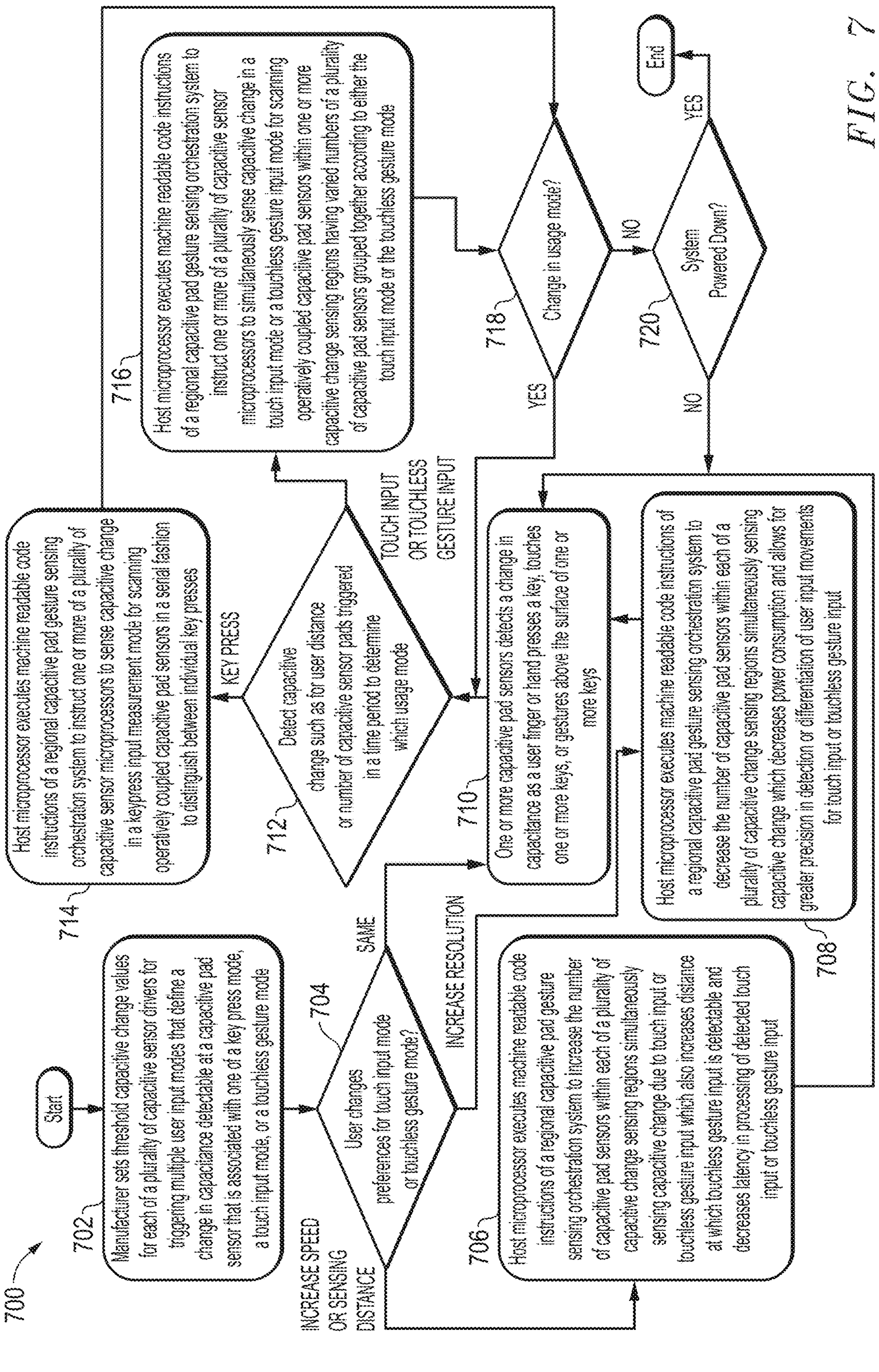
FIG. 7 is a flow diagram showing a method executing machine readable code instructions of a regional capacitive pad gesture sensing orchestration system to adjustably group capacitive sensing pads into capacitive change sensing regions of a capacitive pads layer based on current usage input mode and user preferences at a corresponding removable tactile input layer according to an embodiment of the present disclosure.

FIG. 7 is a flow diagram showing a method 700 of executing machine readable code instructions for adjustably grouping capacitive sensing pads into capacitive change sensing regions of a removable tactile input layer based upon current usage input mode and user preferences for greater precision, greater detection speed, or greater gesture sensing distance above the surface of the removable tactile input layer according to an embodiment of the present disclosure. As described herein, a capacitive sensor microprocessor may execute a capacitive sensor driver to sequentially scan a plural array of capacitive pad sensors, or to simultaneously read capacitance across a plurality of capacitive pad sensors grouped together into a capacitive change sensing region, based on the current usage input mode in embodiments herein. When operating in either the touch input mode or the touchless gesture input mode, and in order to decrease latency in detecting such user input across these areas, a host microprocessor may execute machine readable code instructions of a regional capacitive pad gesture sensing orchestration system to group subsets of the plurality of capacitive pad sensors together within capacitive change sensing regions, each comprising a sectioned portion of the full surface area of the removable tactile input layer.

The host microprocessor may then execute machine readable code instructions of the regional capacitive pad gesture sensing orchestration system to orchestrate simultaneous detection of capacitive change across all capacitive pad sensors within each of these given subsets, to allow for simultaneous detection of capacitive change across these bifurcated portions of the full surface area of the removable tactile input layer. This simultaneous sensing of capacitive change across the plurality of capacitive pad sensors may take less time than the sequential reading of each key individually and reduce latency of detected touch input or touchless gesture input that may span across plural capacitive change detection regions and several capacitive pad sensors. In embodiments herein, the host microprocessor may execute machine readable code instructions of the regional capacitive pad gesture sensing orchestration system to instruct simultaneous sensing of capacitive change across a larger plurality of capacitive pad sensors within one or more larger capacitive change sensing regions while operating in user touchless gesture input mode, in order to increase a distance at which such capacitive changes may be sensed above the surface of the removable tactile input layer. In other embodiments herein, the host microprocessor may execute machine readable code instructions of the regional capacitive pad gesture sensing orchestration system to instruct simultaneous sensing of capacitive change across a smaller plurality of capacitive pad sensors within one or more smaller capacitive change sensing regions while operating in user touch input mode, in order to detect smaller movements of the finger with greater resolution than that which is required for touchless gesture input mode. The host microprocessor may orchestrate such adaptable groupings of the plurality of capacitive pad sensors in embodiments herein by instructing the timing at which one or more capacitive sensor microprocessors operatively coupled to the plurality of capacitive pad sensors detects capacitive changes across those capacitive pad sensors.

At block 702, a manufacturer in an embodiment may set threshold capacitive change values for each of a plurality of capacitive sensor drivers for triggering a key press input, a touch input, and a touchless gesture input. Each of these threshold capacitive change levels in an embodiment may define a change in capacitance detectable at a single capacitive pad sensor that is associated with one of a key press mode for sensing user input via downward force on a key of the removable tactile input layer, a touch input mode for sensing user input via touch contact across the surface of the removable tactile input layer or a touchless gesture mode for sensing user input via hand or finger gesture or movement a distance above the removable tactile input layer. For example, a manufacturer in an embodiment described with respect to FIG. 4 may set a detected change in capacitance level for each of a plurality of capacitive sensor drivers 466*a*, 466*b*, to 466*n* for a key press input, a touch input, and a touchless gesture input. These defined changes may be set for execution of machine readable code instructions of a regional capacitive pad gesture sensing orchestration system 449 by a host microprocessor 468 instructing operation of the one or more capacitive sensor drivers 466*a*, 466*b*, to 466*n* by one or more capacitive sensor microprocessors 467*a*, 467*b*, to 467*n*. Each of these detected change in capacitance levels in an embodiment may define a change in capacitance detectable at a single capacitive pad sensor within one of subgroups of capacitive pad sensors 475*a*, 475*b*, to 475*n* that is associated with one of a key press mode for sensing user input via downward force on a key of the removable tactile input layer 460, a touch input mode for sensing user input via touch contact across the surface of the removable tactile input layer 460 or a touchless gesture mode for sensing user input via hand or finger gesture or movement a distance above the removable tactile input layer 460. More specifically, the key press measurement input mode may be triggered by detection of a change in capacitance meeting a threshold minimum capacitive change for the key press usage input mode, because physical contact and downward pressure on the keys may result in a higher change in capacitance than light touch or touchless gesturing above the keyboard. As another example, the touchless gesture input mode may be triggered by detection of a change in capacitance falling below a threshold capacitive change maximum for the touchless gesture input mode, because touchless gesture above the keyboard or above the lid of the chassis in some embodiments may result in a lowest possible change in capacitance in comparison to downward pressure on the keys or directing touching of the user's finger or hands to the removable tactile input layer 460. As yet another example, the touch input mode may be triggered by detection of a chance in capacitance that is below the threshold minimum for triggering the key press measurement input mode and above the threshold maximum for triggering the touchless gesture input mode.

It may be determined at block 704 in an embodiment whether a user has selected a preference for greater speed (reduced latency) or greater sensing distance versus greater precision for the touch input mode or the touchless gesture mode via user preference inputs at a graphical user interface (GUI) for the regional capacitive pad gesture sensing orchestration system. For example, with reference to FIG. 4, the host microprocessor 468 executing machine readable code instructions of the regional capacitive pad gesture sensing orchestration system 449 in an embodiment may group the plurality of capacitive pad sensors into subgroups 475*a*, 475*b*, to 475*n* for forming distinct capacitive change sensing regions based on the current usage mode. Upon receiving a user preference for greater speed and sensing distance or greater precision level, the host microprocessor 468 executing machine readable code instructions of the regional capacitive pad gesture sensing orchestration system 449 may assign greater or fewer numbers of capacitive pad sensors to each subgroup forming capacitive change sensing regions and determined for each of the touch input mode or the touchless gesture mode. More specifically, each of the usage input modes may be associated with an initial or default assignment of each of the plurality of capacitive pad sensors into subgroups 475*a*, 475*b*, to 475*n* for each of the capacitive change sensing regions as described above with respect to block 702, with the touchless gesture input mode associated with the largest capacitive change sensing regions that include a greater number of capacitive pad sensors, and the touch input mode associated with smaller capacitive change sensing regions including smaller numbers of capacitive pad sensors than for the touchless gesture input mode. In other words, the touchless gesture input mode may be associated with fewer subgroups having a larger number of capacitive pad sensors 475*a* to 475*n* comprising larger capacitive change sensing regions, whereas the touch input mode may be associated with a greater number of subgroups 475*a* to 475*n* but each comprises smaller capacitive change sensing regions with fewer capacitive pad sensors per subgroup.

A user may adjust the size of these capacitive change sensing regions and numbers of capacitive pad sensors per subgroup therein as well as the frequency with which the capacitive changes are sensed within these capacitive change sensing regions and across an entire capacitive pads layer in embodiments herein via a graphical user interface (GUI) of the regional capacitive pad gesture sensing orchestration system 449. If the user has selected a preference for greater speed/lower latency and greater sensing distance for the touch input mode or the touchless gesture mode, the method may proceed to block 706 for increasing the number of capacitive pad sensors assigned to subgroups for each capacitive change sensing region. If the user has selected a preference for greater precision for the touch input mode or the touchless gesture mode, the method may proceed to block 708 for decreasing the number of capacitive pad sensors assigned to each subgroup for each capacitive change sensing region. If the user has not changed the sensitivity level for the touch input mode or the touchless gesture mode, the method may proceed to block 710 for detection of capacitive changes across capacitive pad sensors in a capacitive pads layer as the user interacts with the removable tactile input layer through keypress, touch, or touchless gesture to automatically determine a usage mode to be engaged.

At block 706, in an embodiment in which the user has selected a preference for greater speed/lower latency or a greater sensing distance for the touch input mode or the touchless gesture mode, the host microprocessor may execute machine readable code instructions of a regional capacitive pad gesture sensing orchestration system to increase a number of capacitive pad sensors within sub-groups assigned to the plurality of capacitive change sensing regions for simultaneously sensing capacitive change across region to region due to touch input or touchless gesture input. This increase in the number of capacitive pad sensors assigned to a given capacitive change sensing region provides for faster scanning among plural capacitive change sensing regions for a user's touch input or touchless gesture input spanning plural regions to detect a swipe or cursor movement user input for example. This increase in the number of capacitive pad sensors assigned to each capacitive change sensing region may also increase a distance at which a touchless gesture input is detectable from those capacitive pad sensors as well increase accuracy and speed of the detected touch input or touchless gesture input across those plural regions.

For example, a user may wish to increase a distance above the surface of the removable tactile input layer 460 at which a touchless gesture input may be detected. In such a scenario, the host microprocessor 468 executing machine readable code instructions of the regional capacitive pad gesture sensing orchestration system 449 may increase the number of capacitive pad sensors in each subgroup 475*a*, 475*b*, to 475*n* and assigned to a given capacitive change sensing region for a touchless gesture input mode of operation, because the distance at which capacitive change may be sensed is proportional to the area or size of the capacitive change sensing region across which such a capacitive change may be sensed. As yet another example, a user may wish to decrease latency in detecting user touch input or touchless gesture input. In such a scenario, the host microprocessor 468 executing machine readable code instructions of the regional capacitive pad gesture sensing orchestration system 449 may increase the number of capacitive pad sensors in each subgroup 475*a*, 475*b*, to 475*n* and assigned to a given capacitive change sensing region for either or both of the touch input mode or the touchless gesture input mode, to decrease sensing time by simultaneously sensing capacitance across a larger plurality of capacitive pad sensors in each capacitive change sensing region for a larger area of sensing across the capacitive pads layer, rather than scanning each capacitive sensor pad sequentially (or scanning smaller groups of capacitive sensor pads).

In another example embodiment described with respect to FIG. 5B in which a user wishes to decrease latency in detecting user touch input or touchless gesture input, the host microprocessor 568 may execute machine readable code instructions to increase the number of capacitive pad sensors in each subgroup such as 570*a* to include more than four capacitive pad sensors, to decrease sensing time by simultaneously sensing capacitance across a larger plurality of capacitive pad sensors, such as increasing each subgroup to six or ten capacitive pad sensors for example. In another example embodiment described with respect to FIG. 5C in which a user wishes to increase a distance above the surface of the removable tactile input layer at which a touchless gesture input may be detected, the host microprocessor 568 executing machine readable code instructions may increase the number of capacitive pad sensors such as 541*a* to 548*a*, 541*b* to 548*b*, or others across to 541*n* to 548*n* assigned to a given capacitive change sensing region (e.g., from 32 to 64), because the distance at which capacitive change may be sensed is proportional to the number of capacitive pad sensors in the area or size of the capacitive change sensing region across which such a capacitive change may be sensed. Thus, increasing the size of the given capacitive change sensing region to include 64 of the capacitive pad sensors such as 541*a* to 548*a*, 541*b* to 548*b*, or others across to 541*n* to 548*n*, rather than 32 may increase the distance above the surface of the removable tactile input layer at which touchless gesture input may be detected. The method may then proceed to block 710 for detection of capacitive changes across capacitive pad sensors as the user interacts with the removable tactile input layer through keypress, touch or touchless gesture inputs to determine a usage mode to be employed.

In an embodiment at block 708 in which the user has selected a preference for greater precision for the touch input mode or the touchless gesture mode, the host microprocessor may execute machine readable code instructions of a regional capacitive pad gesture sensing orchestration system to decrease a number of capacitive pad sensors within each of a plurality of capacitive change sensing regions simultaneously sensing capacitive change due to touch input or touchless gesture input. This decrease in the number of capacitive pad sensors assigned to a given capacitive change sensing region may also decrease power consumption or allow for differentiation between smaller user touch or touchless gesture inputs that occur over a smaller surface area.

For example, in an embodiment described with respect to FIG. 4 in which a user wishes to increase resolution of detected touch input when in touch input mode, the host microprocessor 468 executing machine readable code instructions of the regional capacitive pad gesture sensing orchestration system 449 may decrease the number of capacitive pad sensors in a given subgroup 475*a*, 475*b*, to 475*n* and assigned to a given capacitive change sensing region to allow for increased resolution in detecting smaller movements of the user's finger across shorter distances of the removable tactile input layer 460. As another example, in an embodiment described with respect to FIG. 5B in which a user wishes to increase resolution of detected touch input when in touch input mode, the host microprocessor 568 may execute machine readable code instructions to decrease the number of capacitive pad sensors in each subgroup, such as 570*a*, to include fewer than four capacitive pad sensors (e.g., 541*a* and 542*a* in one subgroup and 541*b* and 542*b* in a separate subgroup), to allow for sensing of capacitive changes across shorter distances of the removable tactile input layer, such as between capacitive pad sensors 541*a* and 541*b*, for example.

At block 710 in an embodiment, one or more capacitive pad sensors in the capacitive pads layer may detect a change in capacitance as a user finger or hand presses a key, touches one or more keys, or gestures above the surface of one or more keys. This detected change in capacitance may be received at capacitive sensing microprocessors as well as at a host microprocessor executing machine readable code instructions of the regional capacitive and gesture sensing orchestration system, via the capacitive sensor driver or drivers in an embodiment. For example, in an embodiment described with respect to FIG. 3, the keyboard sensing hardware structure 362 includes interface detection electronics, such as capacitive sensing pads 341*a* to 341*n*, and operates to contactlessly detect user input received on or above the removable tactile input layer 360 installed above the sealed input surface 361 and through which the user may provide input into the information handling system. Detection of changes in capacitance at various levels of capacitance change are detected by the capacitive sensor microprocessor 367 and determined by the execution of the capacitive sensor driver 366 as indicative of a user's keypress inputs, a user's touch inputs, or a user's touchless gesture inputs at or near the keyboard keys 395 or other input surfaces of the keyboard structure 356 or the removable tactile input layer 360. Distinction between user's keypress inputs, a user's touch inputs, or a user's touchless gesture inputs may be determined from the level capacitance detected at one or more of the activated capacitance pad sensors as well as whether plural capacitance pad sensors are activated across a stretch of the capacitive pads layer indicating a touch gesture input or touchless gesture input.

The host microprocessor in an embodiment at block 712 executing machine readable code instructions of the regional capacitive and gesture sensing orchestration system may determine whether the received change in capacitance level and whether plural capacitance pad sensors are activated across a stretch of the capacitive pads layer within a time period is associated with the key press measurement input mode, the touch input mode, or the touchless gesture input mode. As described in an embodiment with reference to FIG. 4, each of these detected changes in capacitance levels in an embodiment may define a change in capacitance detectable at a single capacitive pad sensor (such as within one of subgroups 475*a*, 475*b*, to 475*n*) that is associated with one of a key press mode for sensing user input via downward force on a key of the removable tactile input layer 460, a touch input mode for sensing user input via touch contact across the surface of the removable tactile input layer 460 or a touchless gesture mode for sensing user input via hand or finger gesture or movement a distance above the removable tactile input layer 460. The strength of the capacitance change level detected may indicate various distances of a user's finger or hand away from that capacitive pad sensor to indicate user input associated with the key press measurement input mode, the touch input mode, or the touchless gesture input mode. For example, the key press measurement input mode may be triggered by detection of a change in capacitance meeting a threshold minimum capacitive change for the key press usage input mode, because physical contact and downward pressure on the keys may result in a higher change in capacitance than light touch or touchless gesturing above the keyboard. As another example, the touchless gesture input mode may be triggered by detection of a change in capacitance falling within a range that is below a threshold capacitive change maximum for the touchless gesture input mode, because touchless gesture above the keyboard or above the lid of the chassis in some embodiments may result in a lowest possible change in capacitance detectable have a smaller detection amount in comparison to downward pressure on the keys or directing touching of the user's finger or hands to the removable tactile input layer 460. As yet another example, the touch input mode may be triggered by detection of a change in capacitance that is below the threshold minimum for triggering the key press measurement input mode and above the threshold maximum for triggering the touchless gesture input mode.

In other embodiments, plural capacitive sensor pads linearly arranged across a capacitive pads layer may detect capacitive change levels within a time period that may be very short indicating a movement of a user input gesture. This indication of movement across the plural capacitive pad sensors may be further input into the host microprocessor in an embodiment executing machine readable code instructions of the regional capacitive and gesture sensing orchestration system determining that a touch input or a touchless gesture input is being received. This indication of user input movement may also be used with detected capacitance change levels above to determine between a touch input mode or a touchless gesture input mode in embodiments herein.

If the received change in capacitance is associated with the key press measurement input mode, the method may proceed to block 714 for the host microprocessor in an embodiment executing machine readable code instructions of the regional capacitive and gesture sensing orchestration system instructing each of the capacitive pad sensors to detect capacitive change at each key of the keyboard individually and in a serial fashion to distinguish between individual key presses. If the received change in capacitance is associated with the touch input mode or the touchless gesture input mode, the method may proceed to block 716 for the host microprocessor in an embodiment executing machine readable code instructions of the regional capacitive and gesture sensing orchestration system instructing groups of capacitive pad sensors, each assigned to a different capacitive change sensing region to simultaneously sense capacitive change across their respectively assigned capacitive change sensing regions. Those groups of capacitive pad sensors assigned to the different capacitive change sensing regions may vary in size assigned by the host microprocessor in an embodiment executing machine readable code instructions of the regional capacitive and gesture sensing orchestration system depending on whether a touch input mode or a touchless gesture input mode is determined in embodiments herein.

At block 714, in an embodiment in which the change in capacitance detected at block 710 is associated with the key press measurement input mode, the host microprocessor may execute machine readable code instructions of the regional capacitive pad gesture sensing orchestration system to instruct each of a plurality of capacitive sensor microprocessors to sense capacitive change in operatively coupled capacitive pad sensors in a serial fashion to distinguish between individual key presses for a keypress input measurement mode. A capacitive sensor microprocessor may execute a capacitive sensor driver to sequentially scan a plural array of capacitive pad sensors, or to simultaneously read capacitance across a plurality of capacitive pad sensors grouped together into a capacitive change sensing region, based on the current usage input mode being determined as the keypress input measurement mode in an embodiment. For example, in an embodiment described with respect to FIG. 5A, a plurality of capacitive pad sensors such as 541*a* to 548*a*, 541*b* to 548*b*, or others across to 541*n* to 548*n* in an embodiment may be scanned sequentially or serially for capacitive changes when it is desirable to distinguish between capacitive changes detected at individual capacitive pad sensors such as 541*a* to 548*a*, 541*b* to 548*b*, or others across to 541*n* to 548*n*, such as when the information handling system is currently operating in a key press measurement input mode to detect distinct key presses at individual keys of the keyboard. This provides for a higher level of precision in detecting location of the user's finger at various points across the removable tactile input layer. The method may then proceed to block 718 with the host microprocessor in an embodiment executing machine readable code instructions of the regional capacitive and gesture sensing orchestration system to determine whether the usage input mode has changed from the key press mode to either the touch input mode or the touchless gesture input mode.

In an embodiment at block 716 in which the change in capacitance detected at block 710 is associated with the touch input mode or touchless gesture input mode, the host microprocessor may execute machine readable code instructions of the regional capacitive pad gesture sensing orchestration system to instruct each of a plurality of capacitive sensor microprocessors to simultaneously sense capacitive change in operatively coupled capacitive pad sensors within one or more capacitive change sensing regions, each including a plurality of capacitive pad sensors grouped together according to touch input mode or touchless gesture input mode. For example, the assignment of any given capacitive pad sensor into a subset of capacitive pad sensors making up any given capacitive change sensing region in an embodiment may be defined based on the usage input mode determined at block 712. The grouping of capacitive pad sensors assigned into various capacitive change sensing regions, as determined at blocks 706 or 708, will depend on either the touch input mode or touchless gesture input mode as detected by the host microprocessor in an embodiment executing machine readable code instructions of the regional capacitive and gesture sensing orchestration system in an embodiment.

For example, in an embodiment described with respect to FIG. 5B in which the current usage input mode is the touch input mode, the host microprocessor may execute machine readable code instructions of the regional capacitive pad gesture sensing orchestration system to instruct one or more of the plurality of capacitive sensor microprocessors 567*a*, 567*b*, 567*c*, or 567*d* to simultaneously sense capacitive change in operatively coupled capacitive pad sensors within one or more capacitive change sensing regions 570*a* to 570*h*, 571*a* to 571*h*, 572*a* to 572*h*, or 573*a* to 573*h*, each including a plurality of capacitive pad sensors such as 541*a* to 548*a*, 541*b* to 548*b*, or others across to 541*n* to 548*n* grouped together according to touch input mode. As another example, in an embodiment described with respect to FIG. 5C in which the current usage input mode is the touchless gesture input mode, the host microprocessor may execute machine readable code instructions of the regional capacitive pad gesture sensing orchestration system to instruct one or more of the plurality of capacitive sensor microprocessors 567*a*, 567*b*, 567*c*, or 567*d* to simultaneously sense capacitive change in operatively coupled capacitive pad sensors within one or more capacitive change sensing regions 574*a*, 574*b*, 574*c*, and 574*d*, each including a plurality of capacitive pad sensors such as 541*a* to 548*a*, 541*b* to 548*b*, or others across to 541*n* to 548*n* grouped together according to touchless gesture input mode. The method may then proceed to block 718 to determine whether the usage input mode has changed from the key press mode to either the touch input mode or the touchless gesture input mode.

At block 718, the host microprocessor may determine whether a change in usage input mode has occurred. This may be the case if the detected change in capacitance sensed at block 714 or 716 moves above or below a threshold capacitive change for the most recently determined usage input mode. For example, if the most recently determined usage input mode determined at block 712 is a key press mode, the host microprocessor executing machine readable code instructions of the regional capacitive pad gesture sensing orchestration system may determine a capacitive change detected at block 714 falls below a threshold minimum capacitive change for the key press usage input mode, indicating a shift to the touch input mode or the touchless gesture input mode. As another example, if the most recently determined usage input mode determined at block 712 is a touch input mode, the host microprocessor executing machine readable code instructions of the regional capacitive pad gesture sensing orchestration system may determine a capacitive change detected at block 716 falls below a threshold minimum capacitive change for the touch input mode, indicating a shift to the touchless gesture input mode. As yet another example, if the most recently determined usage input mode determined at block 712 is a touch input mode, the host microprocessor executing machine readable code instructions of the regional capacitive pad gesture sensing orchestration system may determine a capacitive change detected at block 716 exceeds a threshold maximum capacitive change for the touch input mode or meets a threshold minimum capacitive change for the key press measurement input mode, indicating a shift to the key press measurement input mode. In still another example embodiment, if the most recently determined usage input mode determined at block 712 is a touchless gesture input mode, the host microprocessor executing machine readable code instructions of the regional capacitive pad gesture sensing orchestration system may determine a capacitive change detected at block 716 exceeds a threshold minimum capacitive change for the touch input mode, indicating a shift to the touch input mode.

If the usage input mode has not changed, the method may proceed to block 720 to determine whether the information handling system has powered down. If the usage input mode has changed, the method may proceed back to block 712 for determination of an updated user mode. By repeating the loop between blocks 712 and 718 in such a way, the host microprocessor executing machine readable code instructions of the regional capacitive pad gesture sensing orchestration system in an embodiment may continuously orchestrate grouping and ungrouping of the capacitive pad sensors into capacitive change sensing regions or to single keys of the keyboard, and timing of capacitive change detection across the capacitive change sensing regions or keys based on a routinely assessed and updated usage input mode.

It may be determined at block 720 whether the information handling system operating the host microprocessor has powered down. If the information handling system has not powered down, the method may proceed back to block 710 for further detection of change in capacitance at one or more capacitive pad sensors as the user engages with the removable tactile input layer in an embodiment. If the information handling system has powered down, the method may then end. In such a way, the host microprocessor 468 operatively coupled to each of a plurality of capacitive sensor microprocessors 467*a* to 467*n* may execute machine readable code instructions of the regional capacitive pad gesture sensing orchestration system 449 to adjustably group capacitive sensing pads into capacitive change sensing regions of the removable tactile input layer 460 based upon user instruction and current usage input mode.

The blocks of the flow diagrams of FIGS. 6 and 7 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A split keyboard structure of an information handling system having a keyboard sensing hardware structure formed under a sealed input surface of a keyboard chassis comprising:

a hardware processor, a data storage device, and a power management unit (PMU) to provide power to the hardware processor and data storage device;

the keyboard sensing hardware structure, including a plurality of capacitive pad sensors in a capacitive pads layer a grounding layer and an active shielding layer between the plurality of capacitive pad sensors and the grounding layer formed under a sealed input surface of the keyboard chassis, to detect capacitive changes from user interaction with a removable tactile input layer including a keyboard installed onto the sealed input surface;

a host microprocessor to execute machine readable code instructions of a regional capacitive pad gesture sensing orchestration system to receive a detected change in capacitance associated with a user input with a user's finger or hand at a capacitive pad sensor operatively coupled to the host microprocessor via a capacitive sensor microprocessor to determine whether the detected change in capacitance meets a keypress input measurement mode level, a touch input mode level, or a touchless gesture input mode level;

the host microprocessor to execute machine readable code instructions to assign subsets of a first plurality of capacitive pad sensors to each of a plurality of capacitive change sensing regions based on identification of the touch input mode from the detected change in capacitance; and the host microprocessor to execute machine readable code instructions to instruct the capacitive sensor microprocessor to detected capacitive change sensed simultaneously at a first subset of capacitive pad sensors in a first capacitive change sensing region and to detect a second detected capacitive change sensed simultaneously at a second subset of capacitive pad sensors in a second capacitive change sensing region to identify user touch input with reduced latency relative to serially scanning the plurality of capacitive pad sensors in the capacitive pads layer.

2. The split keyboard structure of the information handling system of claim 1, wherein the user touch input includes the user drawing with a finger across a plurality of single keys of the keyboard of the removable tactile input layer.

3. The split keyboard structure of the information handling system of claim 1, wherein the user touch input includes the user drawing with a finger across a portion the removable tactile input layer installed on the sealed input surface of the keyboard chassis of the information handling system situated to either side of a touchpad.

4. The split keyboard structure of the information handling system of claim 1, wherein the user touch input includes the user drawing with a finger across a lid of a display chassis for the information handling system when the display chassis is in a closed position.

5. The split keyboard structure of the information handling system of claim 1, wherein the host microprocessor executes machine readable code instructions to instruct a plurality of capacitive sensor microprocessors to detected capacitive change sensed across plural capacitive change sensing regions and to detect the user touch input with reduced latency relative to serially scanning the plurality of capacitive pad sensors in the capacitive pads layer.

6. The split keyboard structure of the information handling system of claim 1 further comprising:

the host microprocessor for receiving a user instruction via an operatively coupled hardware processor to increase sensitivity to user touch input when operating in touch input mode; and the host microprocessor to execute machine readable code instructions to decrease a number of capacitive pad sensors in each of the first plurality of capacitive pad sensors assigned to each of the plurality of capacitive change sensing regions to increase precision of sensed user touch input from each of the plurality of capacitive change sensing regions that are smaller across the capacitive pads layer.

7. The split keyboard structure of the information handling system of claim 1 further comprising:

the host microprocessor for receiving a user instruction via an operatively coupled hardware processor to decrease latency for detecting user touch input when operating in touch input mode; and the host microprocessor to execute machine readable code instructions to increase a number of capacitive pad sensors in each of the first plurality of capacitive pad sensors assigned to each of the plurality of capacitive change sensing regions to further decrease processing time to detect user touch input across a wider area of the capacitive pads layer.

8. The split keyboard structure of the information handling system of claim 1 further comprising:

the host microprocessor to execute machine readable code instructions to assign subsets of a second plurality of capacitive pad sensors to each of the plurality of capacitive change sensing regions based on identification of the touchless gesture input mode from the detected change in capacitance, wherein the second plurality of capacitive pad sensors assigned to each of the plurality of capacitive change sensing regions in the touchless gesture input mode is greater than the first plurality of capacitive pad sensors assigned to each of the plurality of capacitive change sensing regions in the touch input mode.

9. The method of claim 8 further comprising:

executing machine readable code instructions, via the host microprocessor, to instruct the capacitive sensing microprocessor to serially scan the capacitive pad sensors based on identification of the keypress input measurement mode detecting keypress inputs from the detected change in capacitance at a third capacitance level; and orchestrating, via the host microprocessor executing machine readable code instructions, ungrouping of the plurality of capacitive pad sensors from the plurality of capacitive change sensing regions to assignment to single keys of a keyboard for the removable tactile input layer.

10. The split keyboard structure of the information handling system of claim 1 further comprising:

the host microprocessor to execute machine readable code instructions to serially scan the capacitive pad sensors based on identification of the keypress input measurement mode detecting keypress inputs from the detected change in capacitance.

11. A method of orchestrating capacitive pad sensing across a plurality of capacitive pad sensors for a keyboard sensing hardware structure for a split keyboard structure based on a detected usage input mode comprising:

detecting capacitive changes from user input interaction with a removable tactile input layer installed onto a sealed input surface of a keyboard chassis including a plurality of capacitive pad sensors in a capacitive pads layer, a grounding layer, and an active shielding layer between the plurality of capacitive pad sensors and the grounding layer formed under the sealed input surface of the keyboard chassis;

dynamically orchestrating, via a host microprocessor executing machine readable code instructions, grouping and ungrouping of the plurality of capacitive pad sensors into a plurality of capacitive change sensing regions or to single key capacitive pad sensors of the keyboard, and timing of capacitive change detection across the plurality of capacitive change sensing regions or single key capacitive pad sensors based on a determined usage input mode, including a key press measurement input mode, a touch input mode, and a touchless gesture input mode;

assigning and simultaneously sensing, via the host microprocessor executing machine readable code instructions, a user touch input at a first subset of capacitive pad sensors in a first capacitive change sensing region operatively coupled to at least one of a plurality of capacitive sensor microprocessors while operating in the touch input mode based on identification of the touch input mode from the detected change in capacitance at a first capacitance level; and assigning and simultaneously sensing, via a host microprocessor executing machine readable code instructions, a user touchless gesture input at a second subset of capacitive pad sensors in a second capacitive change sensing region that is larger than the first capacitive change sensing region and is operatively coupled to at least one of the plurality of capacitive sensor microprocessors while operating in the touchless gesture input mode based on identification of the touchless gesture input mode from the detected change in capacitance at a second capacitance level.

12. The method of claim 11, wherein the host microprocessor executing machine readable code instructions instructs a plurality of capacitive sensor microprocessors to detected capacitive change sensed across plural capacitive change sensing regions and to detect the user touch input or the user touchless gesture input with reduced latency relative to serially scanning the plurality of capacitive pad sensors in the capacitive pads layer.

13. The method of claim 11, wherein the removable tactile input layer includes mechanical keyboard keys and the removable tactile input layer is removably coupled to the sealed input surface via an interference fit or magnetic coupling to provide for removal of the removable tactile input layer from the sealed input surface of the keyboard sensing hardware structure.

14. The method of claim 11 further comprising:

receiving input, via the plurality of capacitive sensor microprocessors executing machine readable code instructions of a plurality of capacitive sensor drivers operatively coupled to one or more of the plurality of capacitive pad sensors, for the first capacitive change level for the touch input, for a second capacitive change level for the touchless gesture input, and a third capacitive change level for a user keyboard keypress input.

15. A split keyboard structure of an information handling system having a keyboard sensing hardware structure formed under a sealed input surface of a keyboard chassis comprising:

a hardware processor, a data storage device, and a power management unit (PMU) to provide power to the hardware processor and data storage device;

the keyboard sensing hardware structure, including a plurality of capacitive pad sensors in a capacitive pads layer, a grounding layer, and an active shielding layer between the plurality of capacitive pad sensors and the grounding layer formed under a sealed input surface of the keyboard chassis, to detect capacitive changes from user interaction with a removable tactile input layer including a keyboard installed onto the sealed input surface;

a host microprocessor to execute machine readable code instructions of a regional capacitive pad gesture sensing orchestration system to receive a detected change in capacitance associated with a user input at a capacitive pad sensor operatively coupled to the host microprocessor via a capacitive sensor microprocessor to determine whether the detected change in capacitance meets a keypress input measurement mode level, a touch input mode level, or a touchless gesture input mode level;

the host microprocessor to execute machine readable code instructions to assign first subsets of a first plurality of capacitive pad sensors to each of a plurality of capacitive change sensing regions based on identification of the touch input mode from the detected change in capacitance at a first capacitance level;

the host microprocessor to execute machine readable code instructions to assign subsets of a second plurality of capacitive pad sensors to each of the plurality of capacitive change sensing regions based on identification of the touchless gesture input mode from the detected change in capacitance at a second capacitance level, wherein the second plurality of capacitive pad sensors assigned to each of the plurality of capacitive change sensing regions in the touchless gesture input mode is greater than the first plurality of capacitive pad sensors assigned to each of the plurality of capacitive change sensing regions in the touch input mode; and the host microprocessor to execute machine readable code instructions to instruct the capacitive sensor microprocessor to detect capacitive change sensed simultaneously at a first subset of capacitive pad sensors in a first capacitive change sensing region and to detect a second detected capacitive change sensed simultaneously at a second subset of capacitive pad sensors in a second capacitive change sensing region to identify user touch input or a touchless gesture input with reduced latency relative to serially scanning the plurality of capacitive pad sensors in the capacitive pads layer.

16. The split keyboard structure of the information handling system of claim 15, wherein the host microprocessor executes machine readable code instructions to instruct a plurality of capacitive sensor microprocessors to detected capacitive change sensed across plural capacitive change sensing regions and to detect the user touch input or the user touchless gesture input with reduced latency relative to serially scanning the plurality of capacitive pad sensors in the capacitive pads layer.

17. The split keyboard structure of the information handling system of claim 15 further comprising:

the host microprocessor to execute machine readable code instructions to serially scan the capacitive pad sensors based on identification of the keypress input measurement mode detecting keypress inputs from the detected change in capacitance at a third capacitance level.

18. The split keyboard structure of the information handling system of claim 15 further comprising:

the host microprocessor for receiving a user instruction via an operatively coupled hardware processor to increase sensitivity to user touch input when operating in touch input mode; and the host microprocessor to execute machine readable code instructions to decrease a number of capacitive pad sensors in each of the first plurality of capacitive pad sensors assigned to each of the plurality of capacitive change sensing regions to increase precision of sensed user touch input from each of the plurality of capacitive change sensing regions that are smaller across the capacitive pads layer.

19. The split keyboard structure of the information handling system of claim 15 further comprising:

the host microprocessor for receiving a user instruction via an operatively coupled hardware processor to increase capacitive field distance for detecting user touchless gesture input when operating in the touchless gesture input mode; and the host microprocessor to execute machine readable code instructions to increase a number of capacitive pad sensors in each of the second plurality of capacitive pad sensors assigned to each of the plurality of capacitive change sensing regions to further to detect user touchless gesture input with more capacitive pad sensors across a wider area of the capacitive pads layer.

20. The split keyboard structure of the information handling system of claim 15, wherein the user touchless gesture input includes the user gesturing with a hand above the surface of the removable tactile input layer when a chassis for the information handling system is in an open position.

* * * * *